US012733247B2

(12) United States Patent
Takahashi et al.

(10) Patent No.: US 12,733,247 B2
(45) Date of Patent: Sep. 8, 2026

(54) SEMICONDUCTOR DEVICE INCLUDING A FWD REGION FORMED ON A SUBSTRATE AND IGBT REGION FORMED ON THE SUBSTRATE

(71) Applicant: Mitsubishi Electric Corporation, Tokyo (JP)

(72) Inventors: Tetsuo Takahashi, Tokyo (JP); Hidenori Fujii, Tokyo (JP); Shigeto Honda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 882 days.

(21) Appl. No.: 17/226,735

(22) Filed: Apr. 9, 2021

(65) Prior Publication Data

US 2022/0157809 A1 May 19, 2022

(30) Foreign Application Priority Data

Nov. 16, 2020 (JP) ................................ 2020-190383

(51) Int. Cl.
*H01L 29/739* (2006.01)
*H01L 29/40* (2006.01)
(Continued)

(52) U.S. Cl.
CPC ........... *H10D 84/617* (2025.01); *H10D 8/422* (2025.01); *H10D 12/481* (2025.01);
(Continued)

(58) Field of Classification Search
CPC ............. H01L 29/7803; H01L 29/7804; H01L 29/7805; H01L 29/7808; H01L 29/7395; H01L 29/7396; H01L 29/7397
See application file for complete search history.

(56) References Cited

U.S. PATENT DOCUMENTS

2009/0001411 A1* 1/2009 Tokura ................ H01L 27/0664 257/140
2010/0156506 A1* 6/2010 Tsuzuki .............. H01L 27/0664 257/140
(Continued)

FOREIGN PATENT DOCUMENTS

DE 10 2015 220 171 A1 5/2016
DE 10 2015 221 061 A1 5/2016
(Continued)

OTHER PUBLICATIONS

An Office Action; "Notice of Reasons for Refusal," mailed by the Japanese Patent Office on Nov. 14, 2023, which corresponds to Japanese Patent Application No. 2020-190383 and is related to U.S. Appl. No. 17/226,735; with English language translation.
(Continued)

*Primary Examiner* — Jesse Y Miyoshi
(74) *Attorney, Agent, or Firm* — Studebaker Brackett PLLC

(57) ABSTRACT

According to an aspect of the present disclosure, a semiconductor device includes a FWD region that has, on an upper surface side of a substrate, a p-type anode region, a first p-type contact region having a higher p-type impurity concentration than the p-type anode region, and a first trench, and an IGBT region that surrounds the FWD region in plan view via a boundary region, and has an n-type emitter region, a second p-type contact region, and a second trench on the upper surface side of the substrate, wherein the first trench is formed annularly along an outer edge of the FWD region in plan view, the second trench is formed annularly along an outer edge of the boundary region in plan view, and only a p-type region is provided on an upper surface side of the boundary region.

22 Claims, 34 Drawing Sheets

(51) Int. Cl.

| | |
|---|---|
| ***H01L 29/78*** | (2006.01) |
| ***H01L 29/861*** | (2006.01) |
| ***H10D 8/00*** | (2025.01) |
| ***H10D 12/00*** | (2025.01) |
| ***H10D 64/00*** | (2025.01) |
| ***H10D 84/00*** | (2025.01) |
| ***H10D 84/60*** | (2025.01) |
| *H01L 27/06* | (2006.01) |

(52) U.S. Cl.

CPC ......... *H10D 64/117* (2025.01); *H10D 84/144* (2025.01); *H10D 84/161* (2025.01); *H10D 84/611* (2025.01)

(56) References Cited

U.S. PATENT DOCUMENTS

| | | | | |
|---|---|---|---|---|
| 2015/0249084 | A1 | 9/2015 | Oki et al. | |
| 2016/0035869 | A1 | 2/2016 | Matsudai et al. | |
| 2016/0141400 | A1* | 5/2016 | Takahashi | H01L 29/0649 257/140 |
| 2016/0148928 | A1 | 5/2016 | Soneda | |
| 2016/0163696 | A1* | 6/2016 | Takahashi | H01L 29/0696 257/140 |
| 2016/0329323 | A1* | 11/2016 | Iwasaki | H01L 27/0727 |
| 2017/0141103 | A1* | 5/2017 | Kameyama | H01L 29/1095 |
| 2017/0263603 | A1 | 9/2017 | Hata et al. | |
| 2018/0114829 | A1* | 4/2018 | Nagaoka | H01L 29/7811 |
| 2019/0140084 | A1* | 5/2019 | Shirakawa | H01L 29/7396 |
| 2019/0259747 | A1 | 8/2019 | Gejo | |

FOREIGN PATENT DOCUMENTS

| | | | |
|---|---|---|---|
| DE | 11 2015 004 439 | T5 | 6/2017 |
| JP | 2013-197122 | A | 9/2013 |
| JP | 2015-165542 | A | 9/2015 |
| JP | 2016-072359 | A | 5/2016 |
| JP | 2016-096222 | A | 5/2016 |
| JP | 2016-100464 | A | 5/2016 |
| JP | 2019-145708 | A | 8/2019 |

OTHER PUBLICATIONS

An Office Action; mailed by the China National Intellectual Property Administration of the People's Republic of China on May 29, 2025, which corresponds to Chinese U.S. Appl. No. 202111332602.3 and is related to U.S. Appl. No. 17/226,735.

An Office Action issued by the German Patent and Trademark Office on Jul. 2, 2024, which corresponds to German Patent Application No. 102021120992.7 and is related to U.S. Appl. No. 17/226,735; with English language translation.

* cited by examiner

SEMICONDUCTOR DEVICE INCLUDING A FWD REGION FORMED ON A SUBSTRATE AND IGBT REGION FORMED ON THE SUBSTRATE

BACKGROUND OF THE INVENTION

Field

The present disclosure relates to a semiconductor device.

Background

In general, there are various requirements for a power device, such as a withstand voltage holding capability and a guarantee of a safe operating area to prevent the device from being destructed during operation, and one of the requirements is a reduction in loss. The reduction in the loss of the power device has the effect of reducing the size and weight of the device and, in a broad sense, brings about consideration for the global environment by a reduction in energy consumption. Further, realizing these requirements at the lowest possible cost has been required.

As one means for solving the above issue, a reverse-conducting insulated gate bipolar transistor (RC-IGBT) has been proposed, which realizes the characteristics of an IGBT and a diode in one device. The reverse conducting IGBT has several technical problems, one of which is large recovery loss during diode operation.

In the reverse-conducting IGBT, a p-n junction formed by an anode portion of a diode and an n-drift layer becomes forward-biased during FWD operation, and holes flow into a drift layer 1 to cause conductivity modulation, thereby enabling a reduction in forward voltage drop. However, there has been a problem that when a p-type impurity concentration in the anode region is high, and a large number of excess carriers exist, carriers inside the device are difficult to be discharged, and the recovery loss increases.

In JP 2015-165542 A, a countermeasure against this problem is disclosed. In JP 2015-165542 A, a structure is disclosed in which a diode region is surrounded by an IGBT region. Further, it is disclosed that an anode region formed in the diode region has a high-concentration anode region and a low-concentration anode region. However, in a semiconductor device disclosed in JP 2015-165542 A, depending on the situation of formation of a trench between the IGBT region and an FWD region, a decrease in withstand voltage or a decrease in reverse bias safe operating area (RBSOA) during the IGBT operation may occur.

As described above, in the conventional RC-IGBT, there has been a possibility that the withstand voltage may decrease or the reverse bias safe operating area during the IGBT operation may decrease depending on the state of formation of the trench between the IGBT region and the FWD region.

SUMMARY

The present disclosure has been made to solve the problem as described above, and an object of the present disclosure is to provide a semiconductor device that is suitable for cost reduction and can reduce recovery loss during FWD operation without lowering destruction resistance such as RBSOA.

The features and advantages of the present disclosure may be summarized as follows.

According to an aspect of the present disclosure, a semiconductor device includes a FWD region that is formed on a substrate and has, on an upper surface side of the substrate, a p-type anode region, a first p-type contact region having a higher p-type impurity concentration than the p-type anode region, and a first trench, an IGBT region that is formed on the substrate, surrounds the FWD region in plan view via a boundary region, and has an n-type emitter region, a second p-type contact region, and a second trench on the upper surface side of the substrate and a peripheral region that surrounds the FWD region, the boundary region, and the IGBT region in plan view, wherein the first trench is formed annularly along an outer edge of the FWD region in plan view, the second trench is formed annularly along an outer edge of the boundary region in plan view, and only a p-type region is provided on an upper surface side of the boundary region.

Other and further objects, features and advantages of the disclosure will appear more fully from the following description.

BRIEF DESCRIPTION OF DRAWINGS

FIGS. 15-17 are sectional views of the semiconductor device according to the fourth embodiment.

FIG. 26 is a partially enlarged view of a semiconductor device according to a seventh embodiment.

FIG. 30 is a partially enlarged view of a semiconductor device according to an eighth embodiment.

DESCRIPTION OF EMBODIMENTS

Figure 1:
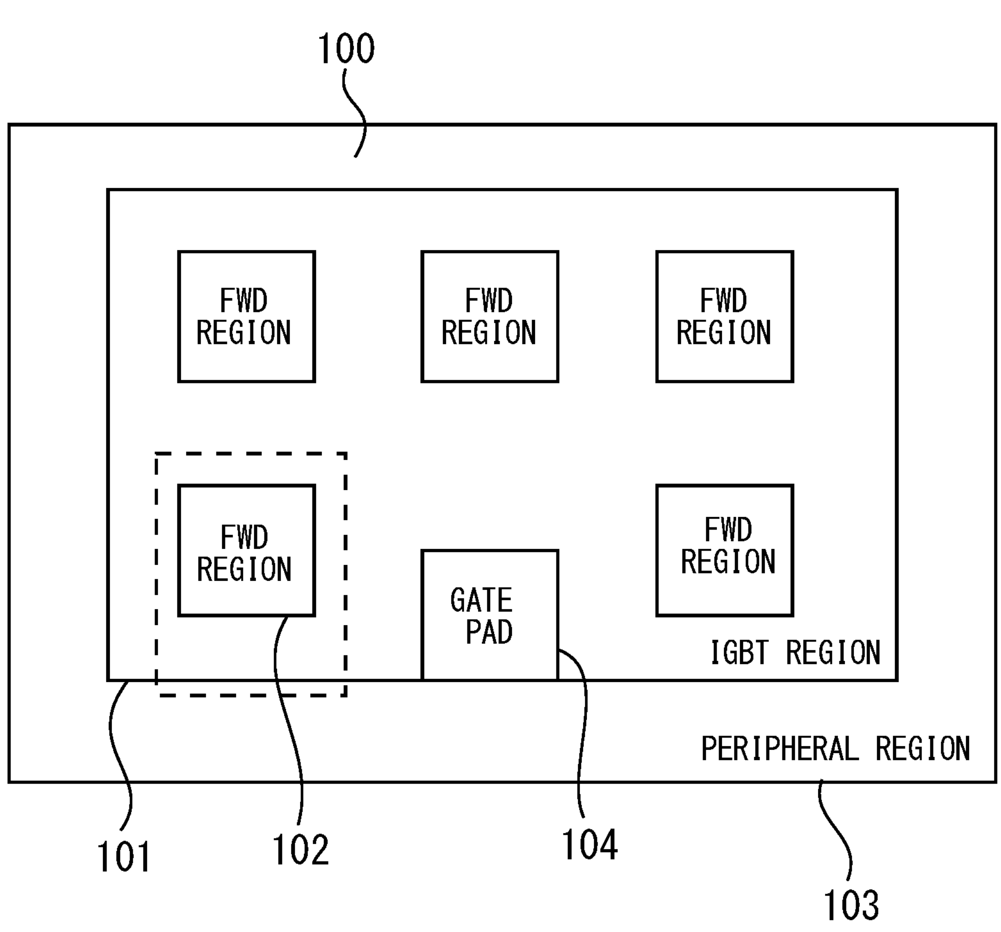
FIG. 1 is a plan view of a semiconductor device according to a first embodiment.

Semiconductor devices according to embodiments of the present disclosure will be described with reference to the accompanying drawings. Components identical or corresponding to each other are indicated by the same reference characters, and repeated description of them is avoided in some cases.

First Embodiment

FIG. 1 is a plan view of a semiconductor device 100 according to a first embodiment. FIG. 1 illustrates the entire semiconductor device in a chip state. The semiconductor device is an RC-IGBT provided with an IGBT region 101, an FWD region 102, a peripheral region 103, and a gate pad region 104. A main electrode region is formed by the IGBT region 101 and the FWD region 102. The IGBT region 101 surrounds the FWD region 102 via a boundary region in plan view. The peripheral region 103 is formed around the main electrode region. The peripheral region 103 surrounds the FWD region 102, the boundary region, and the IGBT region 101 in plan view.

Figure 2:
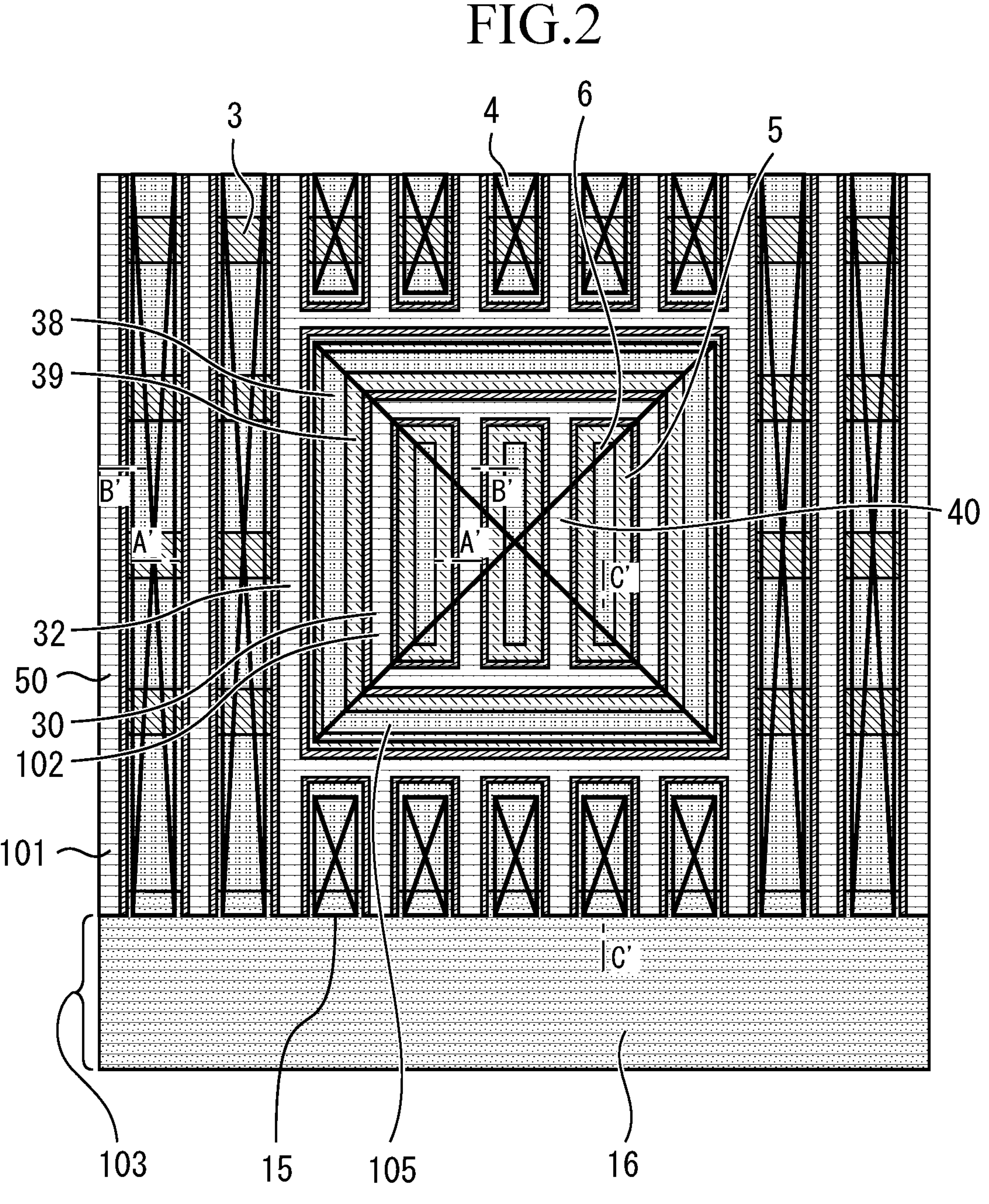
FIG. 2 is a partially enlarged view of the semiconductor device according to the first embodiment.

FIG. 2 is an enlarged plan view of a dotted line portion of FIG. 1. In FIG. 2, electrodes are omitted for convenience of description, and the upper surface of the substrate is illustrated. Between the IGBT region 101 and the FWD region 102, a boundary region 105 is provided. The IGBT region 101 and the FWD region 102 are formed by a plurality of unit cell regions, and one of structures longitudinally repeated in a region sandwiched between the trench and the trench is defined as a unit cell.

In the FWD region 102, a plurality of dummy trenches 40 are formed in parallel. Along the dummy trench 40, a p-type anode region 5 and a first p-type contact region 6 having a higher p-type impurity concentration than the p-type anode region 5 are formed. The first p-type contact region 6 is a p+ type region. The FWD region 102 includes a first trench 30 at an outer edge portion. The first trench 30 is formed annularly along the outer edge of the FWD region 102 in plan view.

In the IGBT region 101, a plurality of trenches 50 are formed in parallel. Along the trench 50, an n-type emitter region 3 and a second p-type contact region 4 are provided alternately. The second p-type contact region 4 is a p+ type region. In the IGBT region 101, a second trench 32 is formed. The second trench 32 is formed annularly along the outer edge of the boundary region 105 in plan view.

The boundary region 105 is a region sandwiched between the first trench 30 and the second trench 32 in plan view. In the example of FIG. 2, the boundary region 105 has a quadrangular shape. There is only a p-type region on the upper surface side of the boundary region 105. According to one example, such a p-type region includes a first p-type region 38 and a second p-type region 39 having a lower p-type impurity concentration than the first p-type region 38. The first p-type region 38 has an annular shape surrounding the FWD region 102 in plan view.

In the peripheral region 103, a p-type well region 16 is formed so as to surround the IGBT region 101. On the periphery of the p-type well region 16 formed in the peripheral region 103, it is possible to provide a field limiting ring (FLR) in which a cell region is surrounded by a p-type termination well layer of a p-type semiconductor or to provide a variation of lateral doping (VLD) in which the cell region is surrounded by a p-type well layer with a concentration gradient. The number of ring-shaped p-type termination well layers used in the FLR and the concentration distribution of the VLD are selected in accordance with the withstand voltage design of the semiconductor device 100.

FIG. 2 illustrates a quadrangular frame in which an X mark is drawn. The quadrangular frame and the inside thereof are a contact region 15. In the contact region 15, the upper surface of a substrate Sb and the emitter electrode 13 are in contact with each other. In a region except for the contact region 15, the substrate Sb and the emitter electrode 13 are not in contact with each other.

Figure 3:
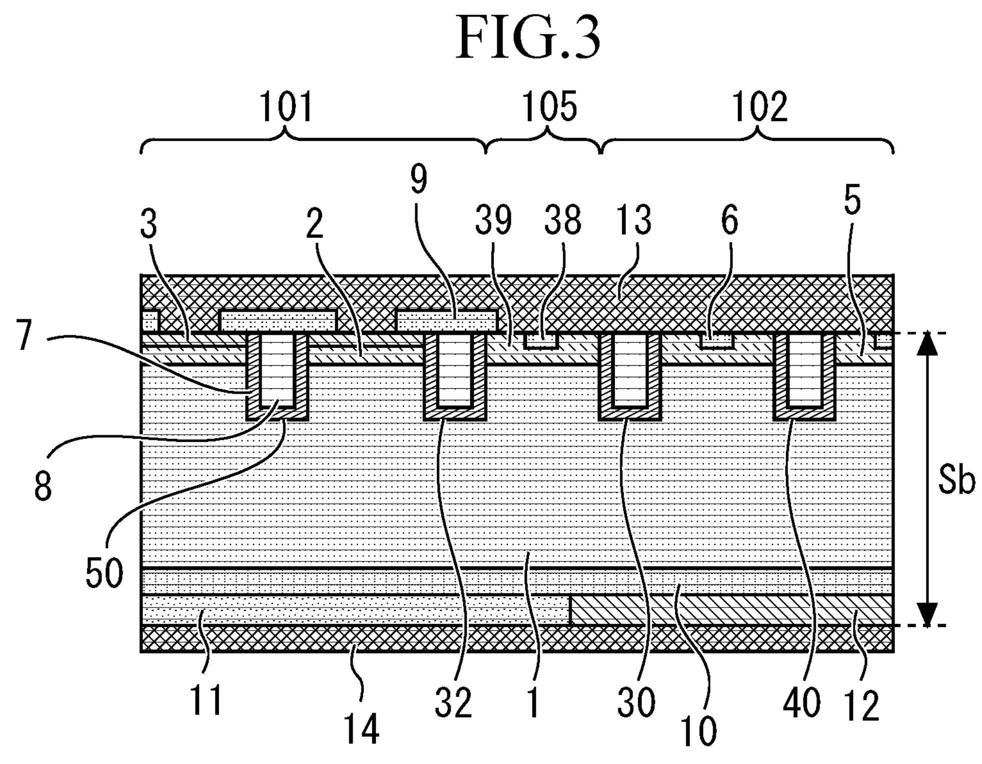
FIGS. 3-5 are sectional views of the semiconductor device according to the first embodiment.
Figure 4:
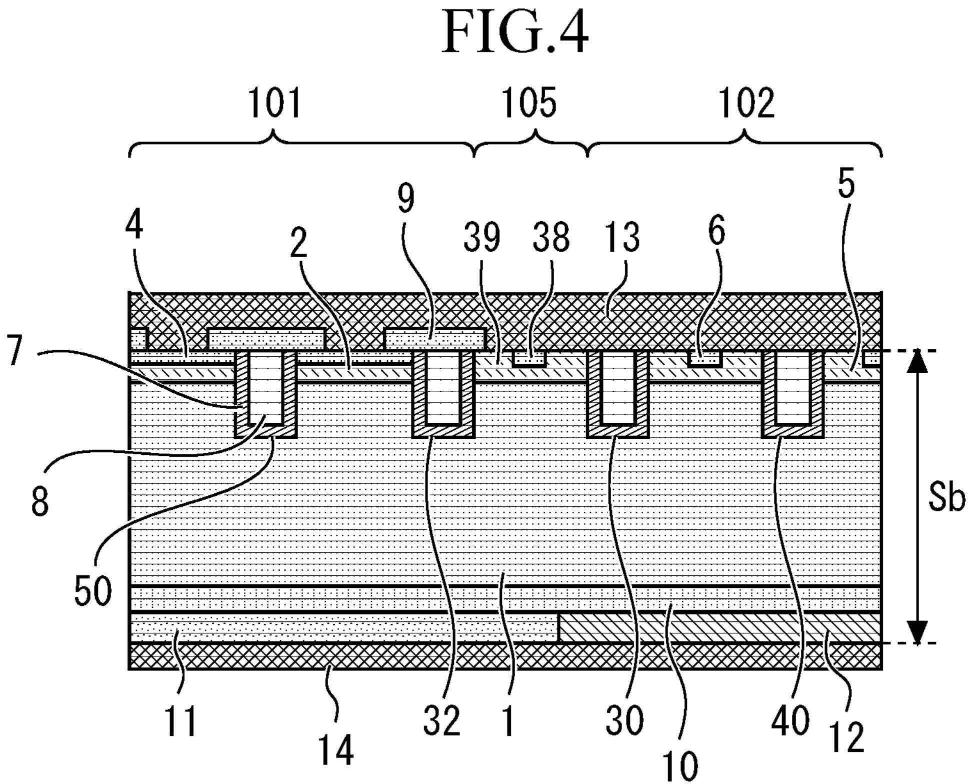
Figure 5:
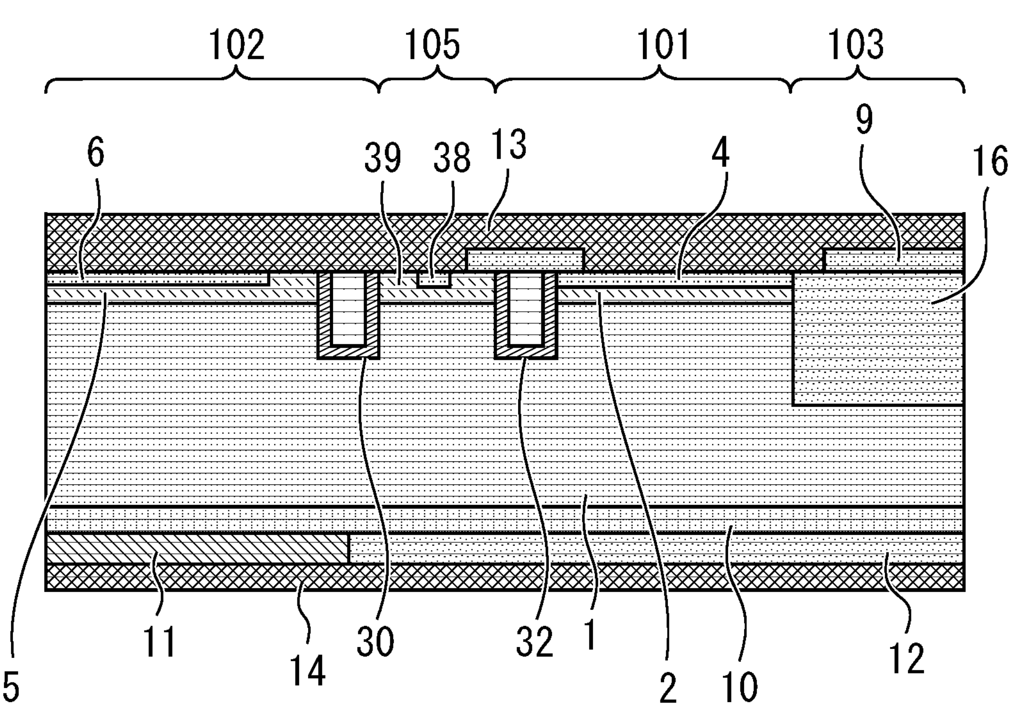

FIG. 3, FIG. 4, and FIG. 5 are a sectional view taken along line A'-A', a sectional view taken along line B'-B', and a sectional view taken along line C'-C' illustrated in FIG. 2, respectively. FIGS. 3 to 5 illustrate the substrate Sb. The substrate Sb has an n-type drift layer 1. FIG. 3 illustrates an emitter electrode 13 provided on the upper surface of the substrate Sb. On the lower surface side of the substrate Sb, an n-type buffer layer 10 is formed. In the IGBT region 101, a p-type collector layer 11 is formed under the buffer layer 10, and in the FWD region 102, an n+ type cathode layer 12 is formed under the buffer layer 10. Under the collector layer 11 and the cathode layer 12, a collector electrode 14 is formed.

The trench 50 of the IGBT region 101 includes a gate insulating film 7 on the inner wall of the trench and a buried gate electrode 8 in contact with the gate insulating film 7. Between the buried gate electrode 8 and the emitter electrode 13, an interlayer insulating film 9 is provided to electrically isolate these electrodes. In the IGBT region 101, an n-channel metal-oxide-semiconductor field-effect transistor (MOSFET) is formed having the drift layer 1, a p-type channel dope 2, the n-type emitter region 3, the gate insulating film 7, and the buried gate electrode 8. The IGBT includes the collector layer 11 in addition to the MOSFET structure.

In the FWD region 102, a diode structure is formed by the p-type anode region 5, the first p-type contact region 6, the drift layer 1, and the cathode layer 12.

As illustrated in FIGS. 3 to 5, in the boundary region 105, the first p-type region 38 and the second p-type region 39 are in contact with the emitter electrode 13.

The gate pad region 104 of FIG. 1 is connected to gate wiring formed inside the IGBT region 101. A portion immediately below the gate pad region 104 is electrically separated from the emitter electrode via an oxide film, for example. Also, over substantially the entire area immediately below the oxide film described above, a p-type termination well layer may be provided, or an n-type drift layer 1 may be formed. Features not described so far will be described below.

A first feature is that the FWD region 102 has an annularly formed first trench 30, and a second trench 32 surrounding the first trench 30 at a fixed interval is formed, whereby the FWD region 102 and the IGBT region 101 are separated from each other.

A second feature is that the boundary region 105 has the first p-type region 38 and the second p-type region 39, the contact region 15 is in contact with both the first p-type region 38 and the second p-type region 39, the second p-type region 39 is in contact with the second trench 32 in plan view, and the first p-type region 38 is not in contact with the second trench 32 in plan view. The distance between the first trench 30 and the second trench 32 of the present embodiment is maximum in the corner portion and is constant in the other portion at a distance less than the maximum distance. Although the first trenches 30 and the second trenches 32 are formed in the quadrangular shape in the present embodiment, the distance between the trenches in the corner portion and the distance between the trenches in the other portion may be made closer by adding a curvature to the corner portion.

A third feature is that the anode of the FWD region 102 is formed by the p-type anode region 5 and the p+ type first p-type contact region 6, and the first p-type contact region 6 is formed as a single line in the longitudinal direction parallel to the trench. The first p-type contact region 6 is formed for each unit cell and has an elongated shape parallel to the first trench 30 in plan view.

A fourth feature is that the high-concentration second p-type contact region 4 in the IGBT region 101 is formed so as to overlap the p-type well region 16, and the p-type well region 16 is not connected to the n-type emitter region 3. In plan view, the p-type well region 16 and the second p-type contact region 4 are in contact with each other.

A fifth feature is that the contact region 15 in the IGBT region 101 includes the p-type well region 16 while including the second p-type contact region 4. FIG. 5 illustrates that the second p-type contact region 4 and the p-type well region 16 are in contact with the emitter electrode 13.

A sixth feature is that the area ratio of the first p-type contact region 6 in the FWD region 102 is lower than the area ratio of the p-type anode region 5. According to another example, in plan view, the sum of the area ratios of the first p-type contact region 6 and the first p-type region 38 is smaller than the sum of the area ratios of the p-type anode region 5 and the second p-type region 39 per unit cell in the FWD region 102 and the boundary region 105.

A seventh feature is that in the boundary region 105, the area ratio of the first p-type region 38 is lower than the area ratio of the second p-type region 39.

An eighth feature is that the area ratio of the first p-type contact region 6 in the FWD region 102 is lower than the area ratio of the second p-type contact region 4 in the IGBT region 101. According to another example, in plan view, the sum of the area ratios of the first p-type contact region 6 and the first p-type region 38 per unit cell in the FWD region 102 and the boundary region 105 is smaller than the area ratio of the second p-type contact region 4 per unit cell in the IGBT region 101.

A ninth feature is that the area ratio of the first p-type region 38 in the boundary region 105 is lower than the area ratio of the second p-type contact region 4 in the IGBT region 101.

A detailed description of the manufacturing method of the present embodiment will be omitted because the manufacturing can be performed using a general IGBT manufacturing technique and changing a pattern in a lithography process.

Next, the operation of the semiconductor device according to the present embodiment will be described. First, a case where the semiconductor device operates as an IGBT will be described. The on-state of the IGBT is started by applying a positive voltage to the buried gate electrode 8 and turning on the n-channel MOSFET provided with the drift layer 1, the channel dope 2, the n-type emitter region 3, the gate insulating film 7, and the buried gate electrode 8. Electrons are injected from the n-type emitter region 3, holes flow in from the collector layer 11, and conductivity modulation occurs in the drift layer 1, whereby the voltage between the emitter and collector is lowered to realize the on-state of the IGBT.

Next, a negative voltage is applied to the buried gate electrode 8 to realize the off-state of the IGBT. When the n-channel MOSFET is turned off, minority carriers accumulated in the drift layer 1 are discharged from the emitter electrode 13 and the collector electrode 14, and the drift layer 1 is depleted gradually. With the voltage being shared by the depleted region, the voltage between the emitter and collector increases, and the off-state is realized.

Next, a case where the semiconductor device according to the present embodiment operates as a diode will be described. The diode structure includes the p-type anode region 5, the first p-type contact region 6, the drift layer 1, and the cathode layer 12. In the on-state during the FWD operation, paired IGBTs are in the off-state, a positive voltage is applied to the emitter electrode 13 with respect to the collector electrode 14, holes flow in from the anode region made up of the p-type anode region 5 and the first p-type contact region 6, and electrons flow in from the cathode region having the cathode layer 12, so that conductivity modulation occurs, and the diode becomes conductive.

Next, when the paired IGBTs shift to the on-state, a negative voltage is applied to the emitter electrode 13 with respect to the collector electrode 14, holes in the drift layer 1 escape from the p-type anode region 5 and the first p-type contact region 6 to the emitter electrode 13, and electrons escape from the cathode layer 12 to the collector electrode 14. However, current continues to flow until excess carriers in the vicinity of the anode region escape, and the p-n junction formed by the p-type anode region 5, the first p-type contact region 6, and the drift layer 1 becomes reverse-biased. Then, when the excess carriers in the vicinity of the anode region escape, and the p-n junction formed by the p-type anode region 5, the first p-type contact region 6, and the drift layer 1 becomes reverse-biased, the reverse recovery current starts to decrease, and when the excess carriers in the drift layer 1 are discharged, the recovery process is completed, and the state becomes a cut-off state. The first p-type region 38 and the second p-type region 39 function similarly to the p-type anode region 5 and the first p-type contact region 6.

In the RC-IGBT, the FWD region 102 is formed adjacent to the IGBT region 101, and during the IGBT operation, holes from the collector layer 11 flow into not only the IGBT region 101 but also the FWD region 102 by diffusion. Thus, at the time of turn-off during the IGBT operation, holes having flowed into a part of the FWD region 102 in addition to the IGBT region 101 are discharged from the emitter electrode 13.

Therefore, when a hole current is concentrated in the IGBT region in the vicinity of the FWD region 102 to increase the potential of the channel dope 2, and a voltage for canceling a built-in potential is applied to the n-type emitter region 3 and the p-type impurity region such as the channel dope 2 forming the p-n junction with the n-type emitter region 3, a thyristor formed by the n-type emitter region 3, the channel dope 2, the drift layer 1, and the collector layer 11 is turned on. As a result, control by the gate electrode becomes impossible, and the device may be damaged in some cases. This is referred to as a decrease in reverse bias safe operating area (RBSOA). In the vicinity of the peripheral region 103, a hole component diffused further into the peripheral portion is also included, and hence a further decrease in the safe operating area can occur.

However, in the present embodiment, the first, second, fourth, and fifth features and the like can prevent the decrease in the reverse bias safe operating area during the IGBT operation. First, as in the second feature, the boundary between the IGBT region 101 and the FWD region 102 is separated by the second trench 32 and the first trench 30, and the trench surrounds the FWD region 102 at a regular interval in the boundary region 105. Since the first p-type region 38 and the second p-type region 39 are formed between the first trench 30 and the second trench 32 while an n-type impurity region such as an n+ emitter is not formed, no parasitic thyristor is generated. Also, since the first p-type region 38 and the second p-type region 39 in the boundary region 105 are grounded to the emitter electrode 13, it is possible to prevent a deterioration in reverse bias safe operating area.

Since the IGBT region 101 and the FWD region 102 are separated by the trench, and the p-type channel dope 2 and the p-type anode region 5 are not connected, the hole current having entered the FWD region 102 and the boundary region 105 does not flow into the IGBT region 101. It is thereby possible to prevent the deterioration in the reverse bias safe operating area.

Further, as the fourth and fifth features, the high-concentration second p-type contact region 4 in the IGBT region 101 is formed so as to overlap or to be in contact with the p-type well region 16, and the contact region 15 in the IGBT region 101 includes the second p-type contact region 4 and the p-type well region 16. Thus, when the IGBT is turned off, the holes existing in the peripheral region 103 flow from the p-type well region 16 to the contact region 15 through the second p-type contact region 4, so that the hole current can be prevented from flowing into the cell in which the n-type emitter region 3 is formed. Hence it is possible to prevent the decrease in the safe operating area. In general, countermeasures against hole inflow from a peripheral region, which includes a deep p-type diffusion layer having a high concentration, have been insufficient, but this feature enables the improvement.

The second, third, sixth, and seventh features can reduce recovery loss during the FWD operation. As the second and third feature, in the FWD region 102 and the boundary region 105, the p-type anode region 5, the first p-type contact region 6, the first p-type region 38, and the second p-type region 39 are formed, and the effective impurity concentration of the anode of the diode is lowered. Furthermore, with the emitter electrode 13 being in contact with the p-type anode region 5, the first p-type contact region 6, the first p-type region 38, and the second p-type region 39, the concentration of the hole current flowing thereinto can be prevented. Therefore, holes near the anode can be efficiently discharged during the recovery operation, and the recovery loss can be reduced.

The forward voltage drop and the recovery loss of the diode have a trade-off relationship with the anode concentration of the diode, and it is effective to reduce the effective concentration of the anode when the recovery loss is to be reduced. As in the sixth and seventh features, the recovery loss can be reduced by reducing the area of the first p-type contact region 6 having a high concentration. When the area ratio of the first p-type contact region 6 is set to about 10 to 50%, for example, the recovery loss can be reduced effectively. Further, according to the eighth and ninth features, the deterioration in the reverse bias safe operating area can be prevented by setting the p-type impurity concentration of the IGBT region 101 to be high, and the recovery loss during FWD operation can be reduced by setting the p-type impurity concentration of the FWD region 102 and the boundary region 105 to be low.

In addition, as in the third feature, each of the first p-type contact region 6 and the first p-type region 38 is formed by a long one p-type region in the FWD region 102 and the boundary region 105, and hence the contact width can be stabilized rather than when a narrow contact hole is formed. This makes it possible to stably form the p-type impurity concentration in the anode region in each of the FWD region 102 and the boundary region 105.

The variations, modifications, or alternatives described in the first embodiment can be applied to semiconductor devices according to the following embodiments. The difference between each of the semiconductor devices according to the following embodiments and the semiconductor device according to the first embodiment will be mainly described.

Second Embodiment

Figure 6:
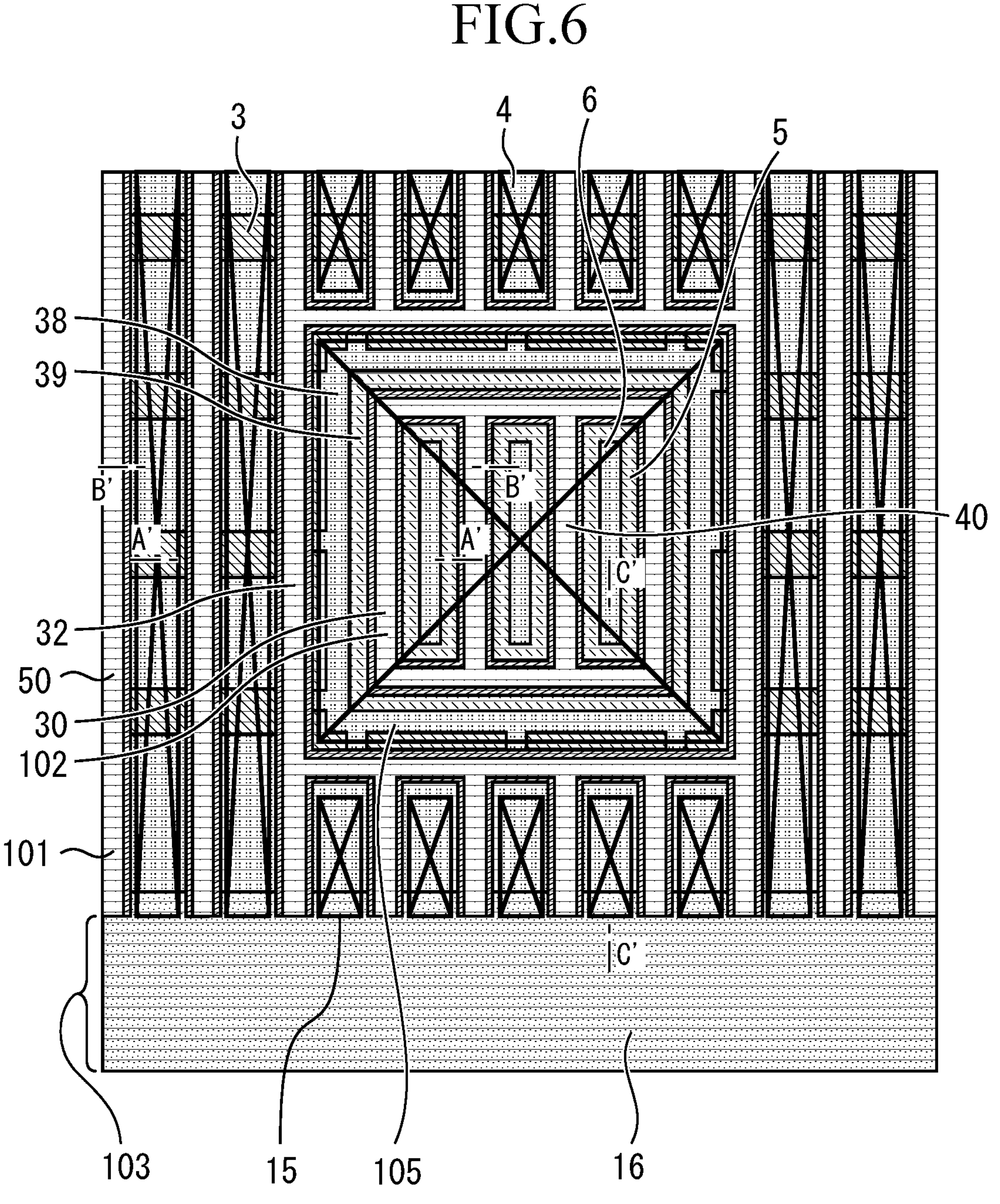
FIG. 6 is a partially enlarged view of a semiconductor device according to a second embodiment.
Figure 7:
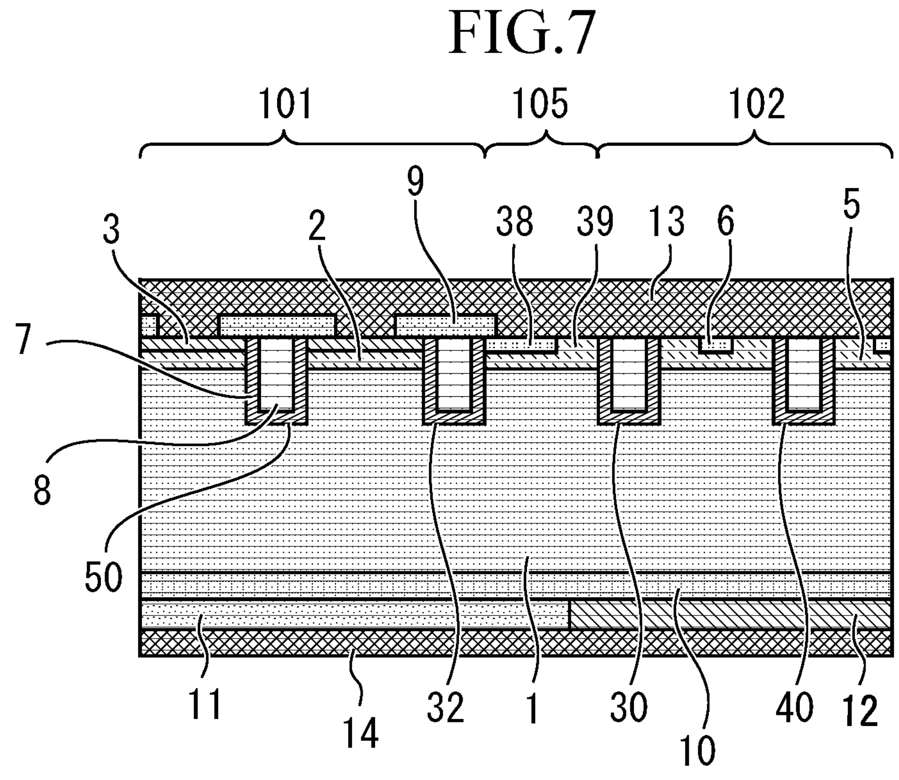
FIGS. 7-9 are sectional views of the semiconductor device according to the second embodiment.
Figure 8:
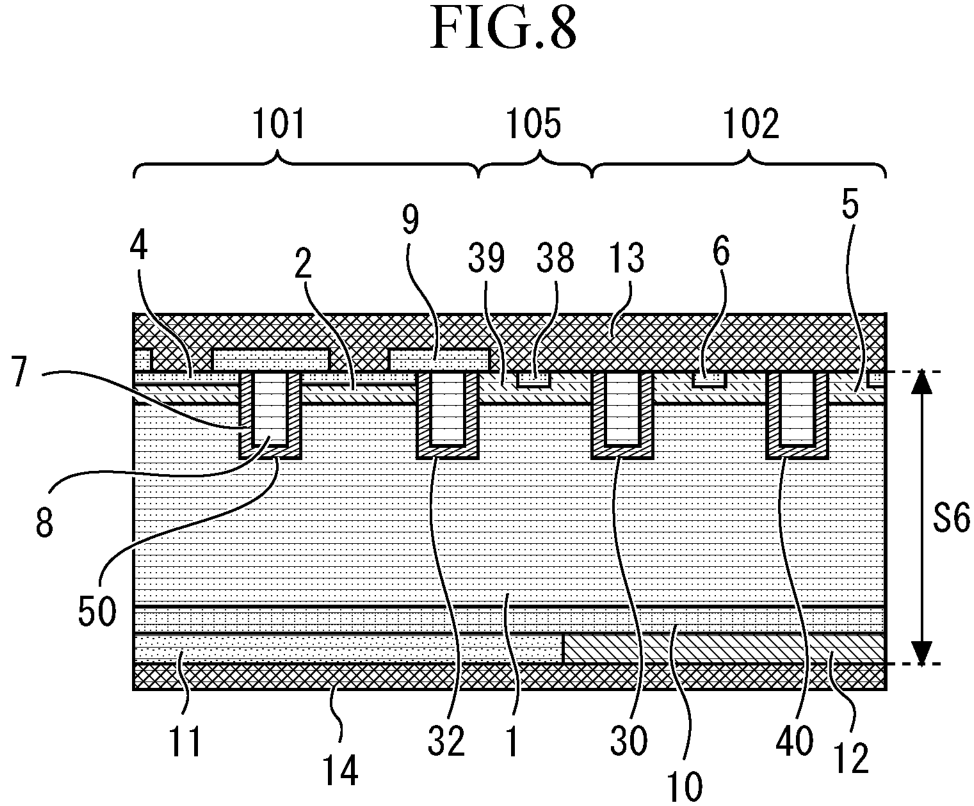
Figure 9:
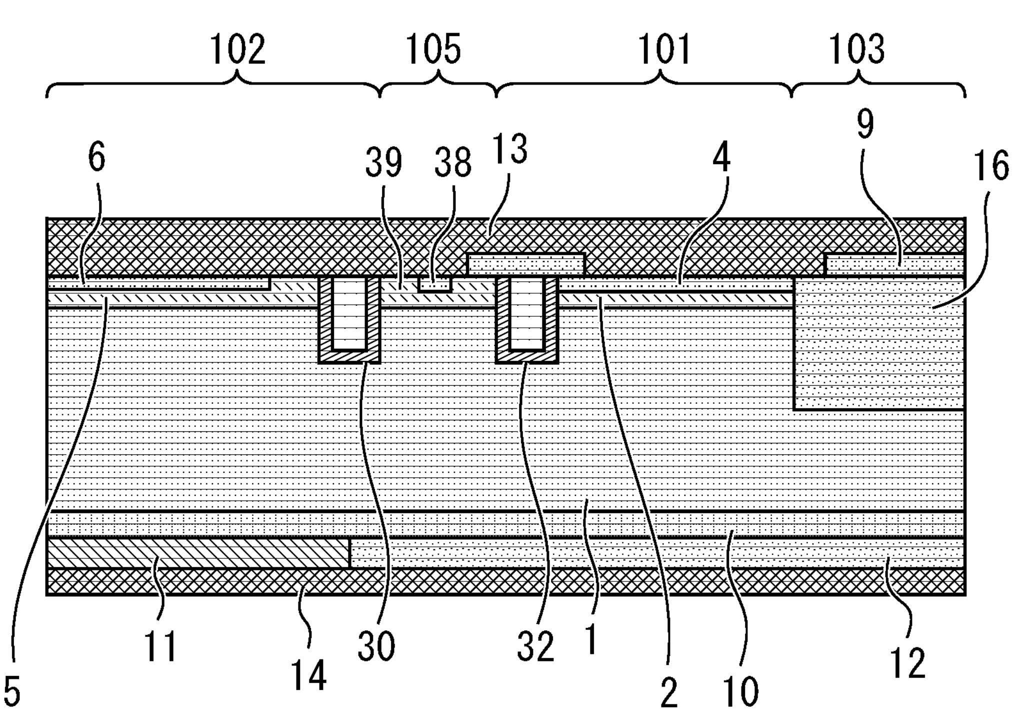

FIG. 6 is a partial plan view of a semiconductor device according to a second embodiment. FIG. 6 corresponds to the plan view of the broken line portion of FIG. 1. FIGS. 7 to 9 are a sectional view taken along line A'-A', a sectional view taken along line B'-B', and a sectional view taken along line C'-C' illustrated in FIG. 6, respectively.

The second trench 32 is in contact with both the first p-type region 38 and the second p-type region 39. FIG. 6 illustrates that the second p-type region 39 and the first p-type region 38 are in contact with the second trench 32 in plan view. FIG. 7 illustrates that the second p-type region 39 and the first p-type region 38 are in contact with the second trench 32 in a sectional view. Further, a portion of the first p-type region 38 which is in contact with the second trench 32 in plan view faces the n-type emitter region 3.

In the on-state of the IGBT operation, a hole current flows from the collector side in the IGBT region 101, but a part of the current also flows in the boundary region 105 and the FWD region 102. Therefore, at the boundary of the IGBT region 101, current tends to concentrate at the time of turn-off, and in particular, in the vicinity of the n-type emitter region 3, the resistance of the channel dope 2 immediately below the n-type emitter region increases, so that latch-up tends to occur, causing a deterioration in reverse bias safe operating area.

In the present embodiment, since the p-type impurity concentration of the boundary region 105 on the IGBT region side is set to be high, a component of the hole current which flows from the boundary region 105 to the emitter electrode 13 increases during the IGBT operation, and the decrease in the reverse bias safe operating area can be prevented. Further, since the first p-type region 38 is disposed in the vicinity of the portion immediately below the n-type emitter region 3, which tends to cause latch-up, it is possible to further prevent the decrease in the reverse bias safe operating area during the IGBT operation.

Third Embodiment

Figure 10:
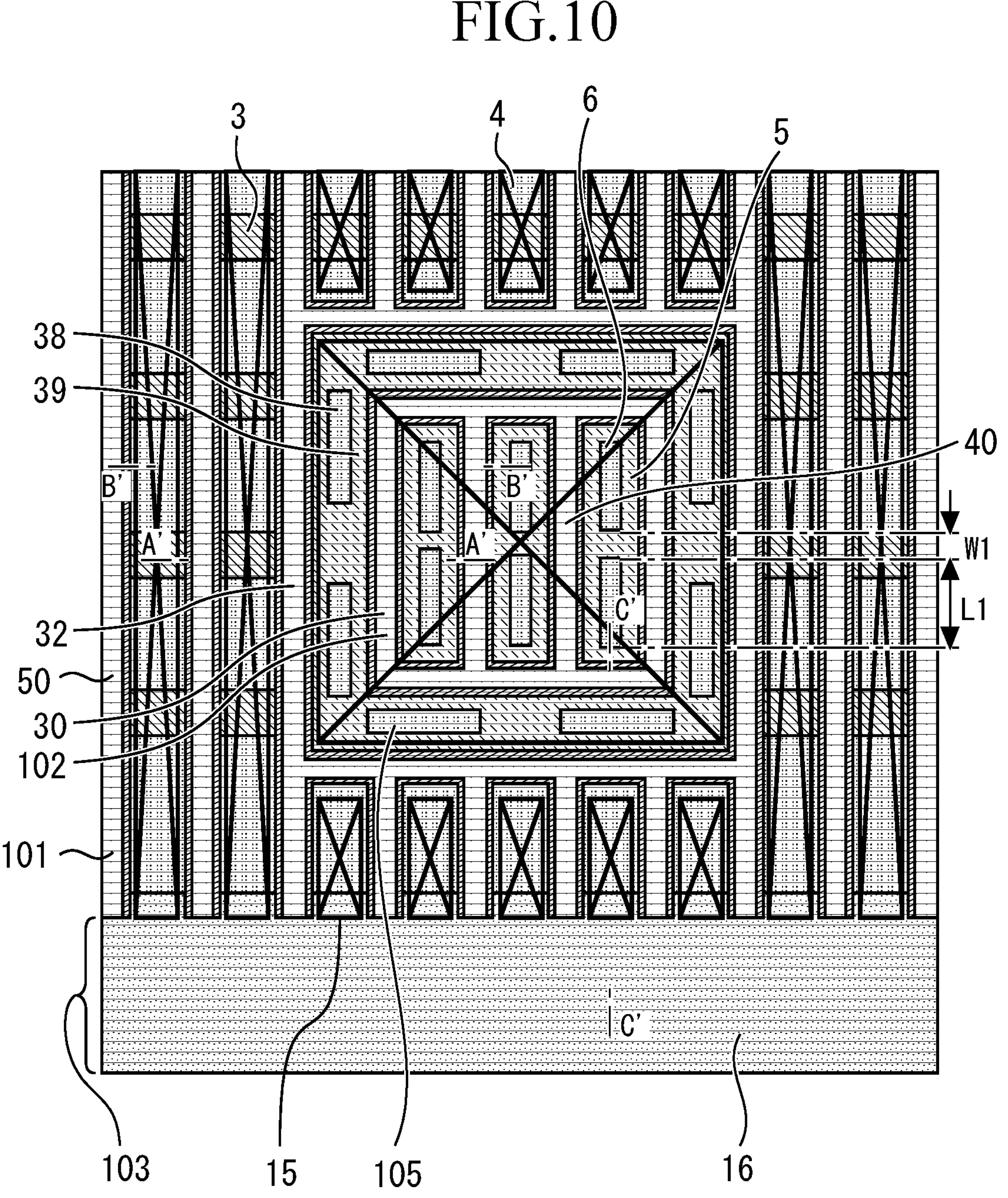
FIG. 10 is a partially enlarged view of a semiconductor device according to a third embodiment.
Figure 11:
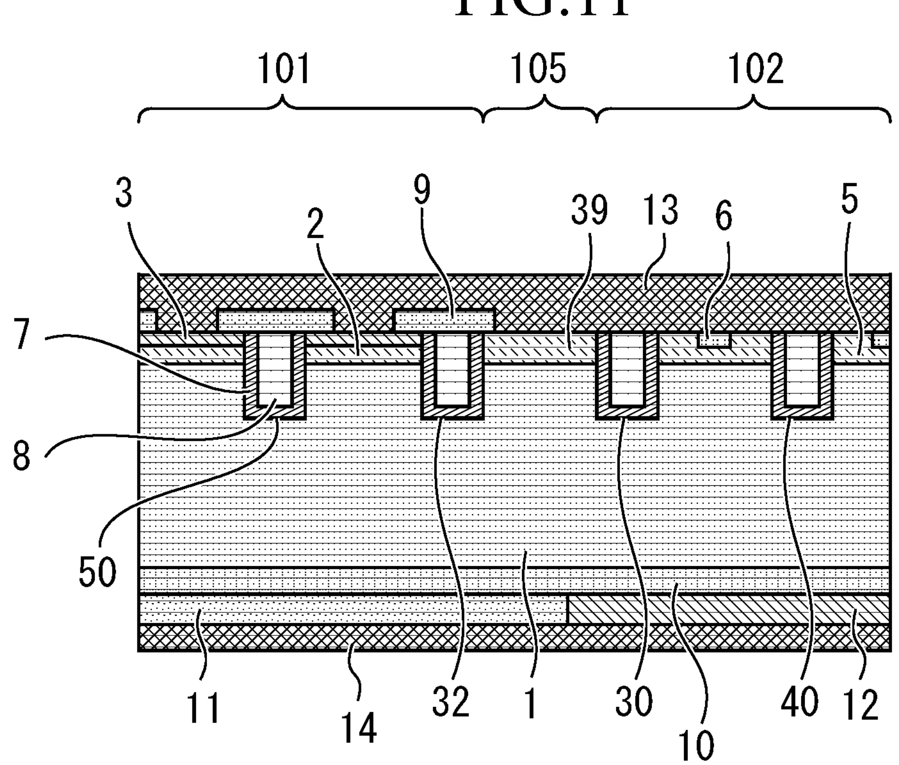
FIGS. 11-13 are sectional views of the semiconductor device according to the third embodiment.
Figure 12:
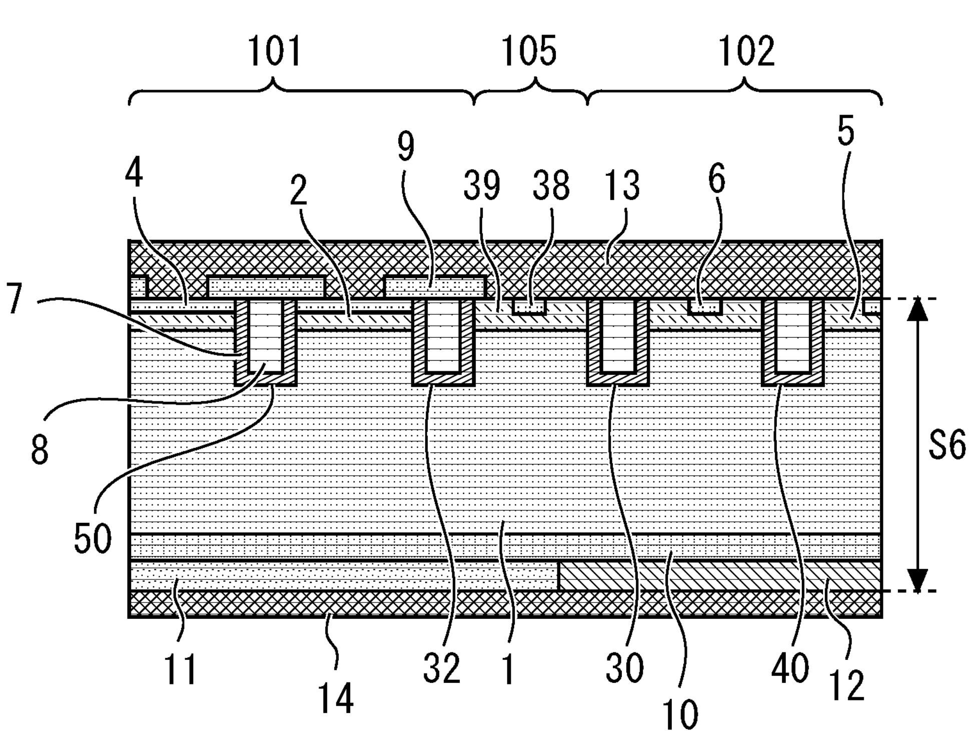
Figure 13:
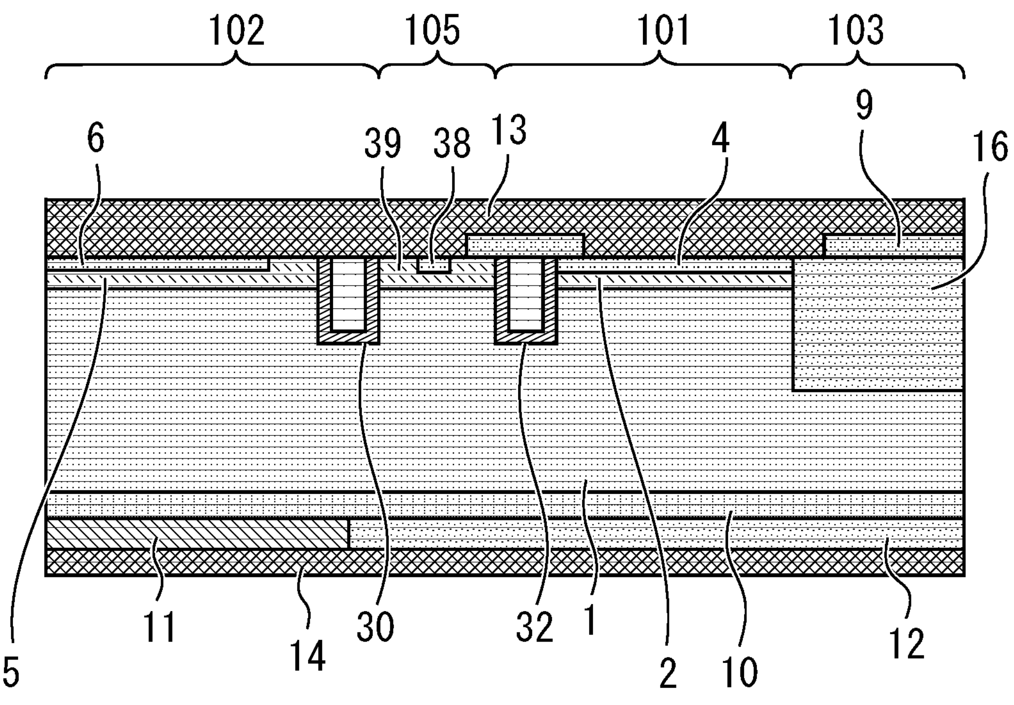

FIG. 10 is a partial plan view of a semiconductor device according to a third embodiment. FIG. 10 corresponds to the plan view of the broken line portion of FIG. 1. FIGS. 11 to 13 are a sectional view taken along line A'-A', a sectional view taken along line B'-B', and a sectional view taken along line C'-C' illustrated in FIG. 10, respectively.

The first p-type contact region 6 formed in the FWD region 102 and the first p-type region 38 formed in the boundary region 105 are made up of a plurality of rectangular patterns extending in the longitudinal direction. When the length in the longitudinal direction of the rectangular pattern is L1 and the interval is W1, L1≥W1 is satisfied. The first p-type contact region 6 is formed for each unit cell and has a plurality of rectangular portions parallel to the first trench 30 in plan view. The longitudinal length of each of the plurality of rectangular portions is larger than the distance between the plurality of rectangular portions. In plan view, the area of the first p-type contact region 6 is smaller than the area of the p-type anode region 5 in the FWD region 102 per unit cell.

It is thereby possible to stabilize the contact width in manufacturing and to stably form the p-type impurity concentration of the p-type anode region 5. It is thereby possible to stably improve the recovery characteristic. Further, by forming the first p-type contact region 6 longer in the longitudinal direction and larger in size, the manufacturing variation can be reduced, and the recovery characteristic can be stabilized.

Fourth Embodiment

Figure 14:
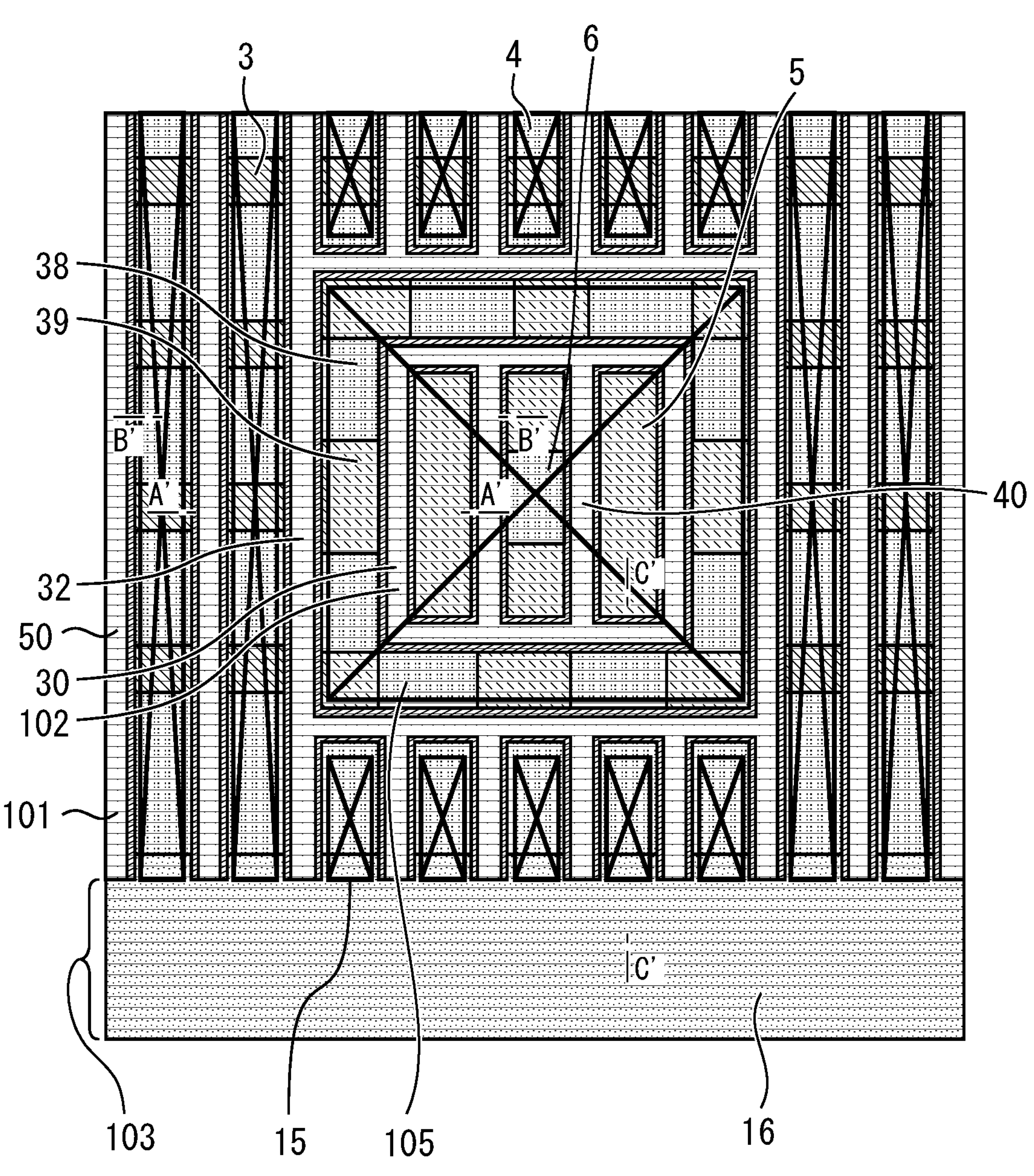
FIG. 14 is a partially enlarged view of a semiconductor device according to a fourth embodiment.
Figure 15:
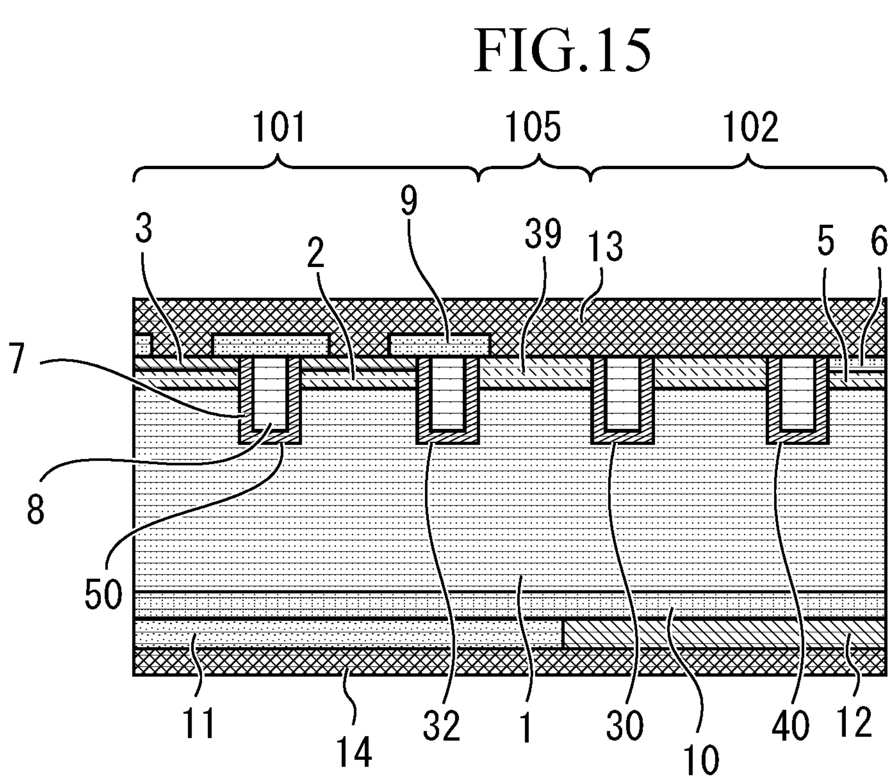
Figure 16:
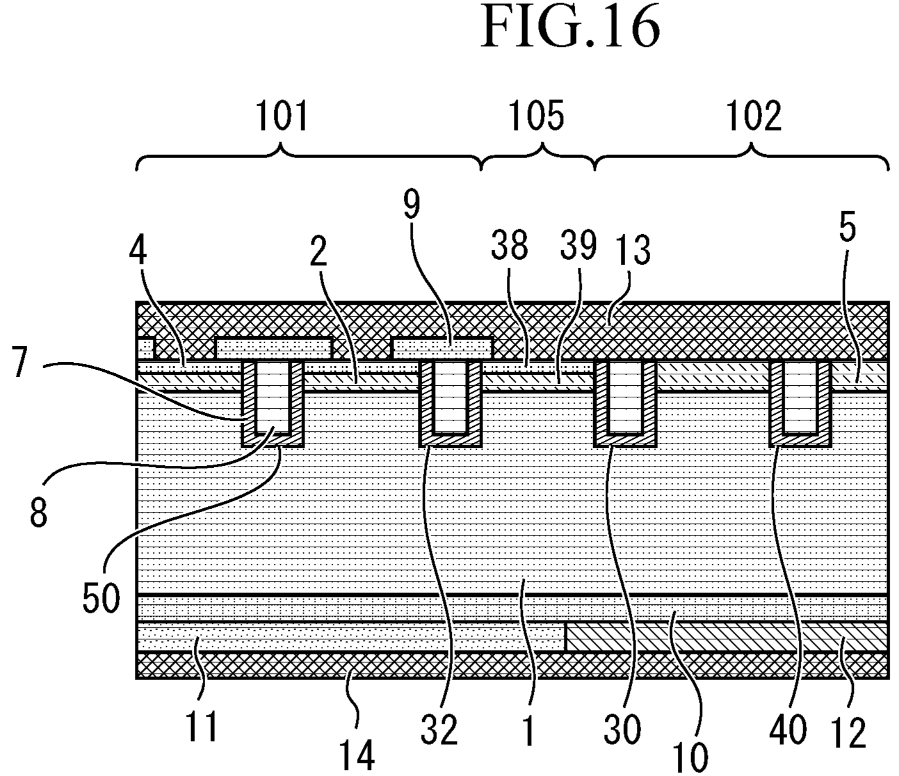
Figure 17:
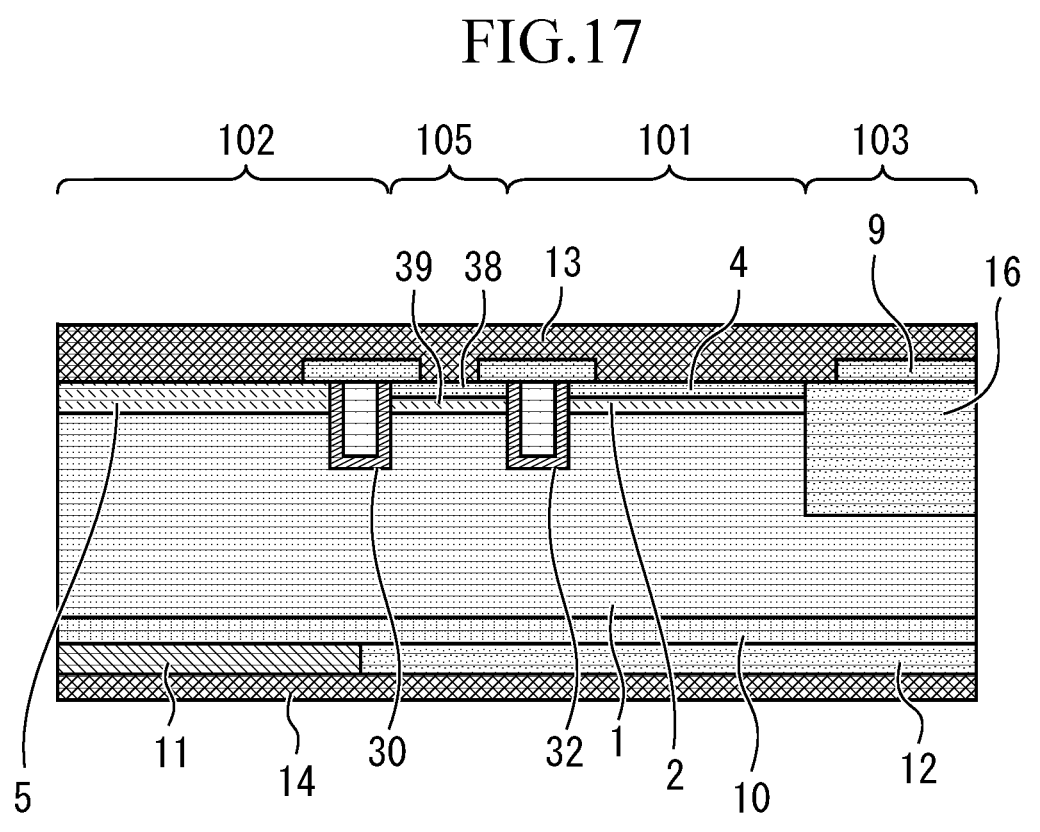

FIG. 14 is a partial plan view of a semiconductor device according to a fourth embodiment. FIG. 14 corresponds to the plan view of the broken line portion of FIG. 1. FIGS. 15 to 17 are a sectional view taken along line A'-A', a sectional view taken along line B'-B', and a sectional view taken along line C'-C' illustrated in FIG. 14, respectively.

The p-type anode region 5 has a portion formed linearly in a plan view and having the first p-type contact region 6 formed partially, and a portion formed linearly in plan view and not having the first p-type contact region 6 formed partially. Further, in the boundary region 105, the first p-type region 38 and the second p-type region 39 are alternately provided to make the p-type region annular in plan view.

Moreover, according to one example, the sum of the areas of the first p-type contact region 6 and the first p-type region 38 is smaller than the sum of the areas of the p-type anode region 5 and the second p-type region 39.

According to the semiconductor device of the fourth embodiment, the total area of the first p-type contact region 6 in the entire FWD region 102 can be made smaller than the total area of the p-type anode region 5 while the size of the first p-type contact region 6 is selected to be a size with which stable manufacturing is possible. It is thereby possible to stably form the p-type impurity concentration in the anode region of the FWD region 102 and to stably improve the recovery characteristic. By the FWD region 102 having a unit cell that includes no first p-type contact region 6, the size of the first p-type contact region 6 per unit cell is increased to some extent. As a result, the size of the contact region 15 in the first p-type contact region 6 increases, so that it is possible to reduce the dimensional variation and to stabilize the recovery characteristic.

Fifth Embodiment

Figure 18:
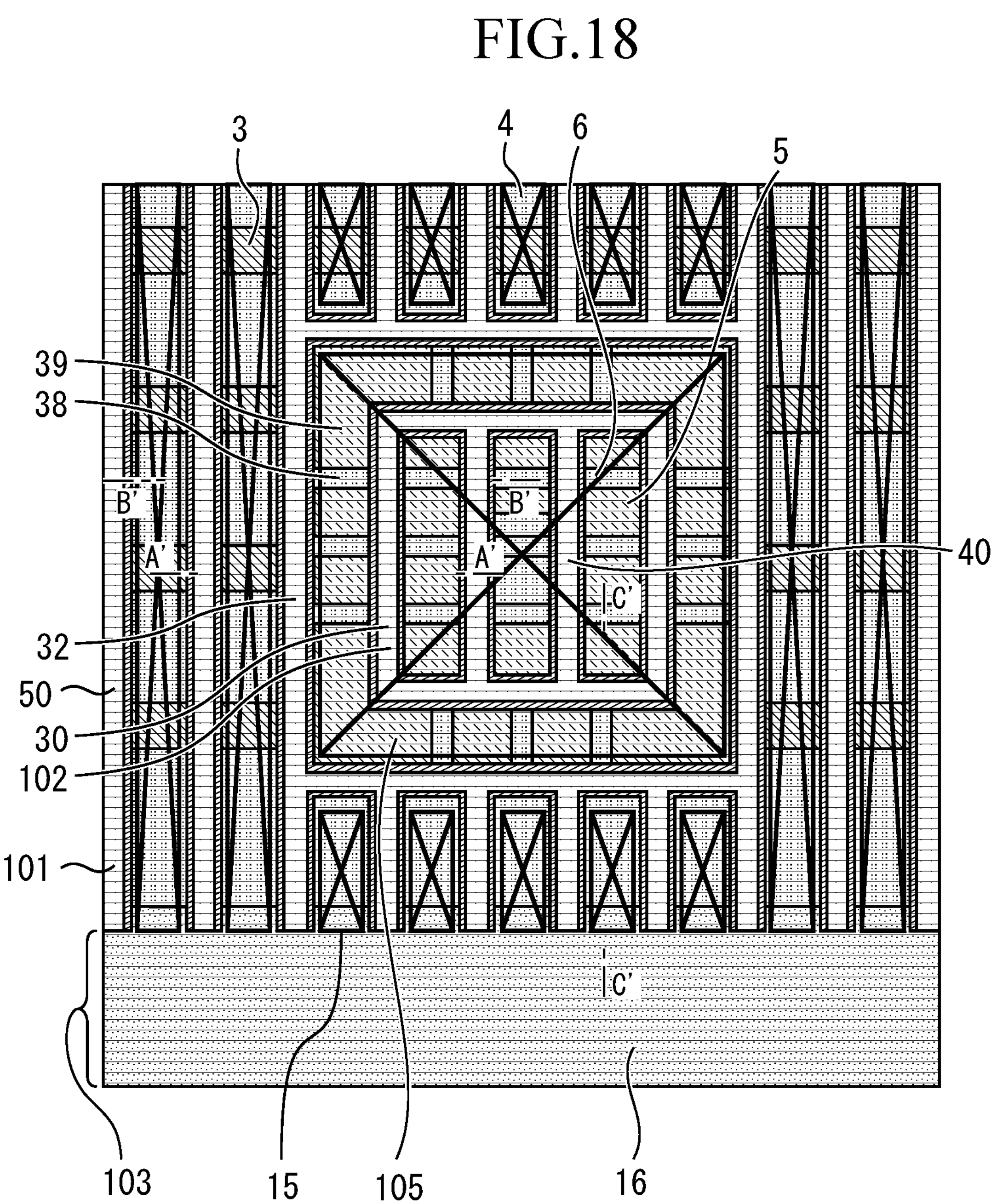
FIG. 18 is a partially enlarged view of a semiconductor device according to a fifth embodiment.
Figure 19:
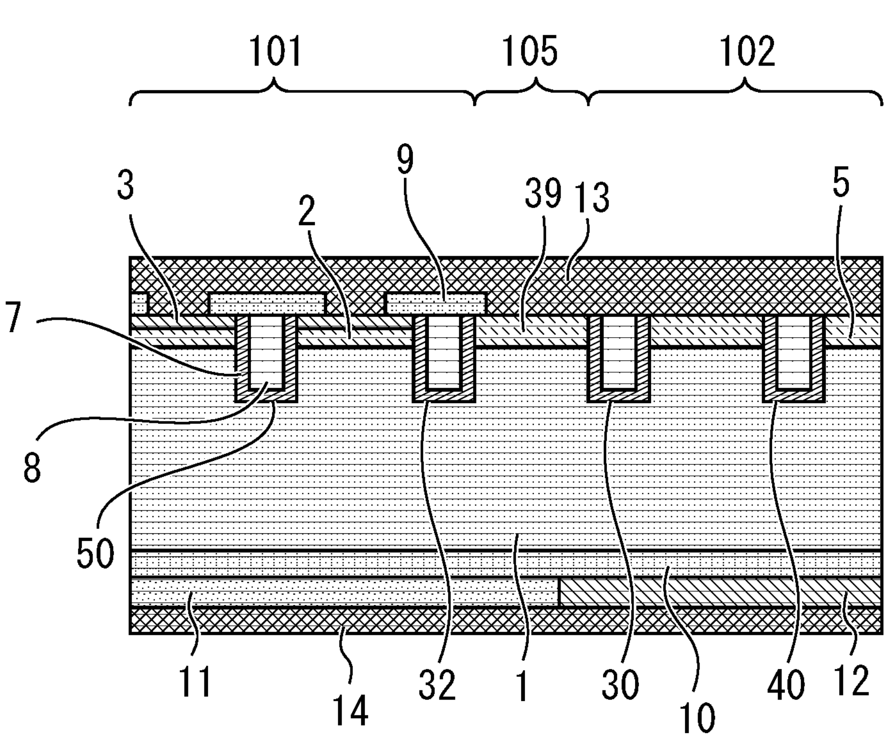
FIGS. 19-21 are sectional views of the semiconductor device according to the fifth embodiment.
Figure 20:
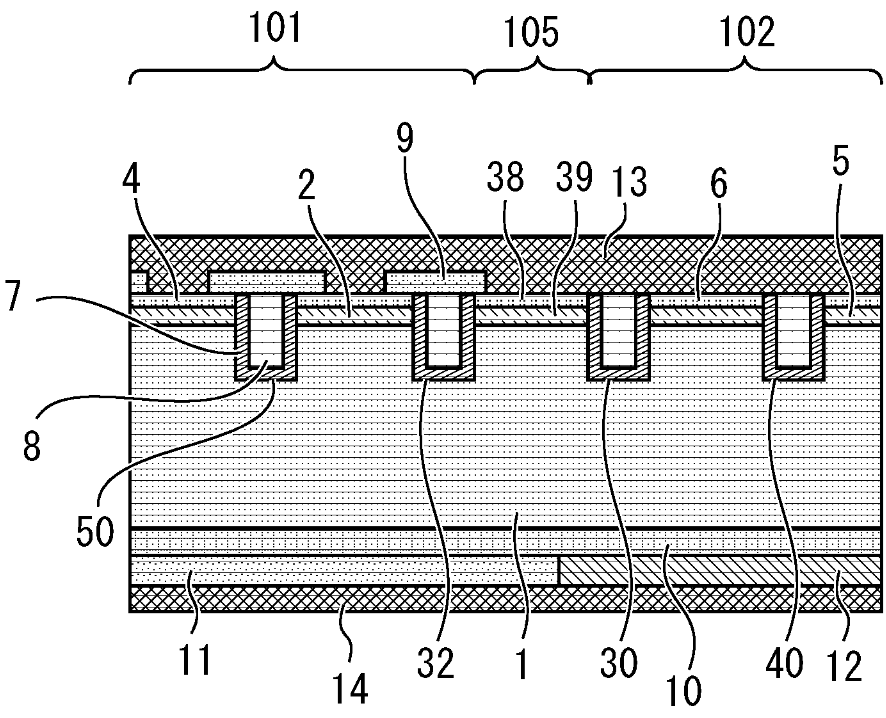
Figure 21:
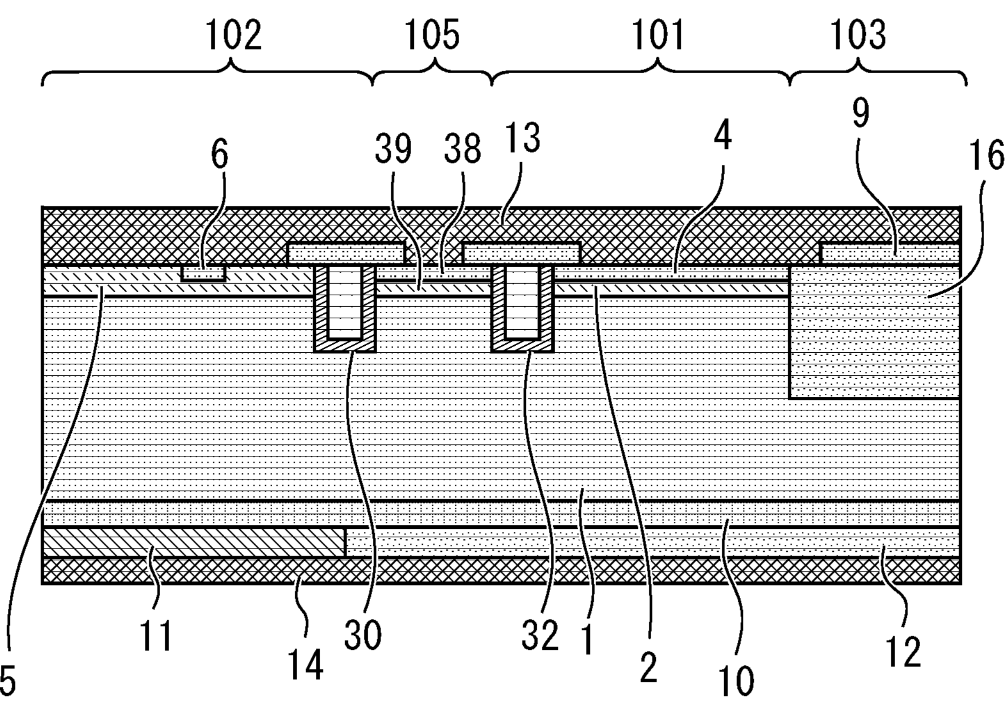

FIG. 18 is a partial plan view of a semiconductor device according to a fifth embodiment. FIG. 18 corresponds to the plan view of the broken line portion of FIG. 1. FIGS. 19 to 21 are a sectional view taken along line A'-A', a sectional view taken along line B'-B', and a sectional view taken along line C'-C' illustrated in FIG. 18, respectively.

The first p-type contact region 6 and the p-type anode region 5 are alternately provided in plan view, and the first p-type region 38 and the second p-type region 39 are alternately provided in plan view. According to one example, the area of the first p-type contact region 6 is smaller than the area of the p-type anode region 5 in plan view. In other words, in plan view, the area of the first p-type contact region 6 is smaller than the area of the p-type anode region 5 per unit cell.

According to the semiconductor device of the fifth embodiment, the total area of the first p-type contact region 6 can be made smaller than the total area of the p-type anode region 5 in the entire FWD region 102 while the size of the first p-type contact region 6 is selected to be a size with which stable manufacturing is possible. It is thereby possible to stably form p-type impurities in the p-type anode region 5 of the FWD region 102 and to reliably improve the recovery characteristic. Further, by alternately providing the first p-type contact region 6 and the p-type anode region 5, the first p-type contact region 6 is partially disposed, thus enabling improvement in the recovery characteristic during the FWD operation.

Sixth Embodiment

Figure 22:
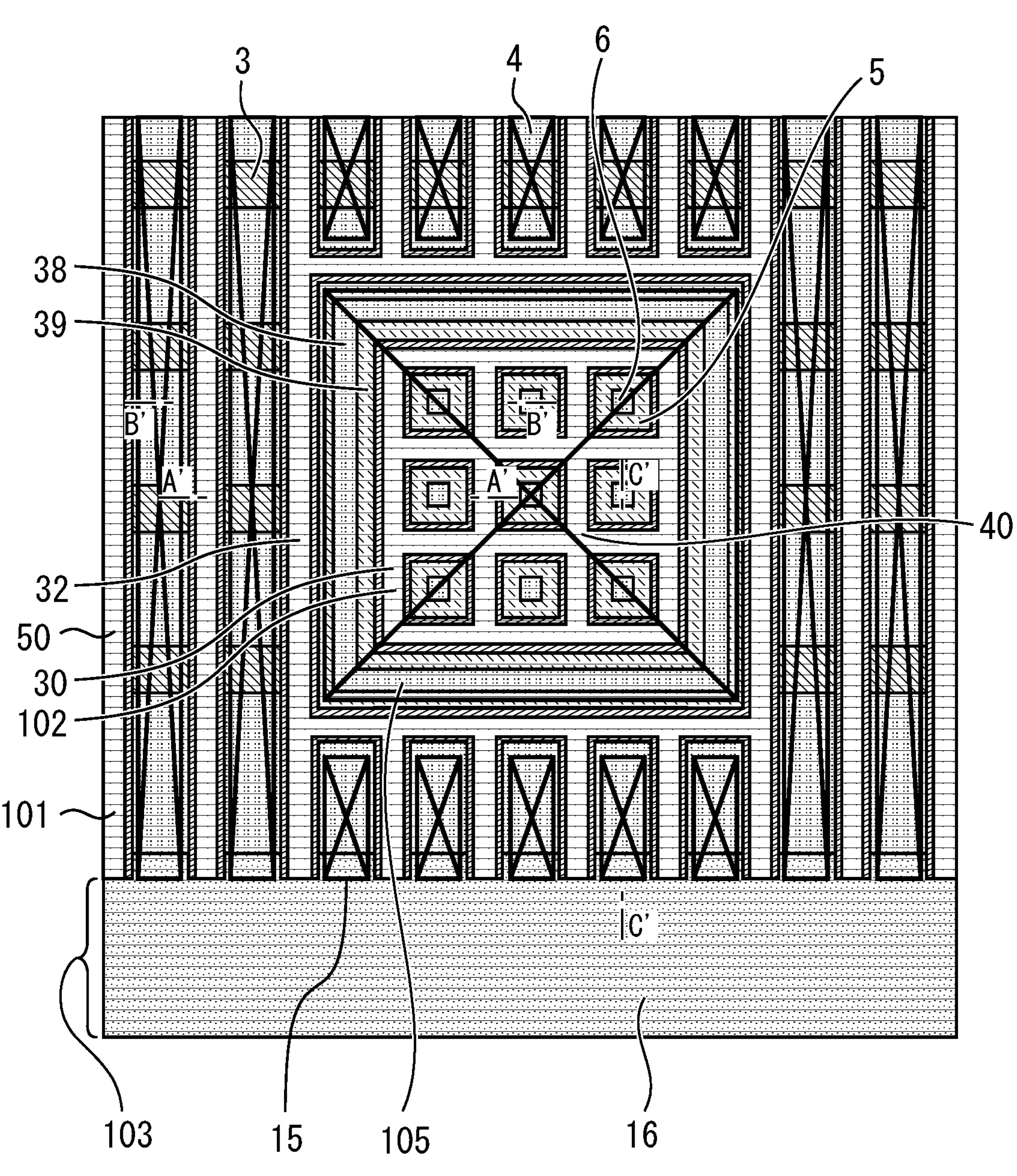
FIG. 22 is a partially enlarged view of a semiconductor device according to a sixth embodiment.
Figures 23, 24:
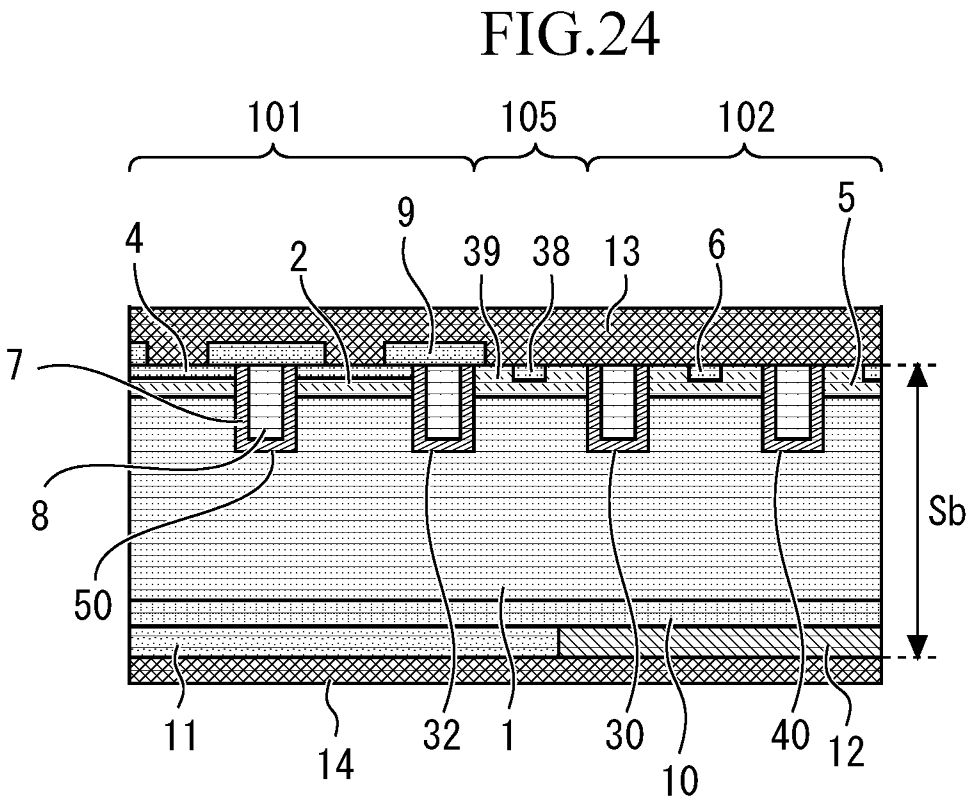
FIGS. 23-25 are sectional views of the semiconductor device according to the sixth embodiment.
Figure 25:
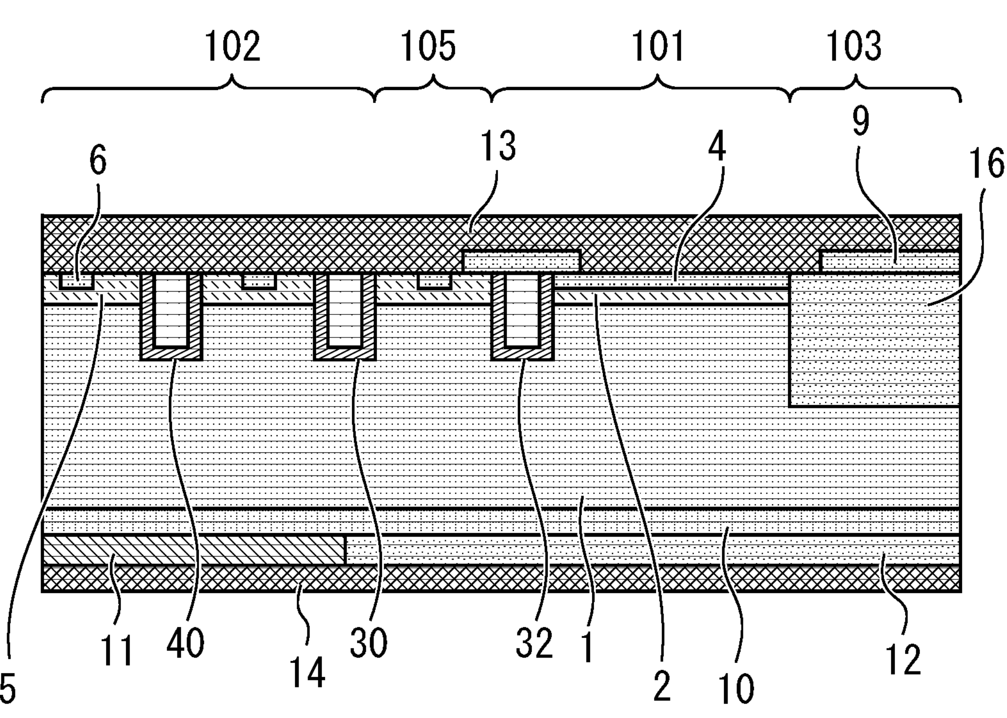

FIG. 22 is a partial plan view of a semiconductor device according to a sixth embodiment. FIG. 22 corresponds to the plan view of the broken line portion of FIG. 1. FIGS. 23 to 25 are a sectional view taken along line A'-A', a sectional view taken along line B'-B', and a sectional view taken along line C'-C' illustrated in FIG. 22, respectively.

The dummy trench 40 is provided in the FWD region 102 in a grid in plan view. That is, a structure is formed in which the FWD region 102 is divided into a mesh by the dummy trench 40. The first p-type contact region 6 and the p-type anode region 5 are formed in the region partitioned by the dummy trench. According to one example, the area of the first p-type contact region 6 is smaller than the area of the p-type anode region 5 per unit cell. As illustrated in FIG. 22, in plan view, a plurality of regions, in each of which the first p-type contact region 6 and the p-type anode region 5 are formed, is provided, and the area of the first p-type contact region 6 is smaller than the area of the p-type anode region 5.

According to the present embodiment, it is possible to stably form p-type impurities of the FWD region 102 and to stably improve the recovery characteristic. Further, by forming the size of the P-type contact region in the cell portion of the FWD region 102 to be large, the dimensional variation can be reduced, so that the recovery characteristic is stabilized.

Seventh Embodiment

Figure 26:
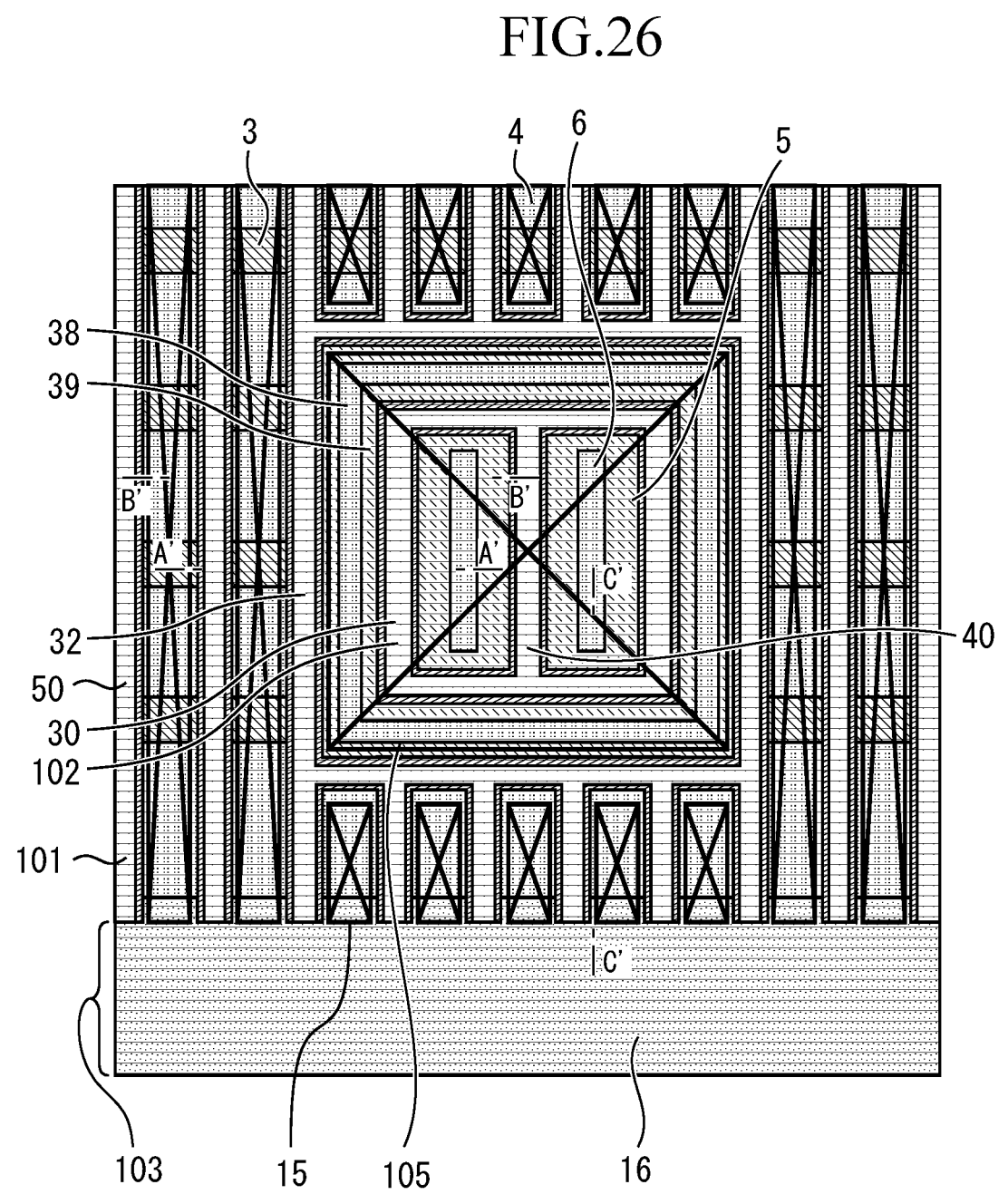
Figure 27:
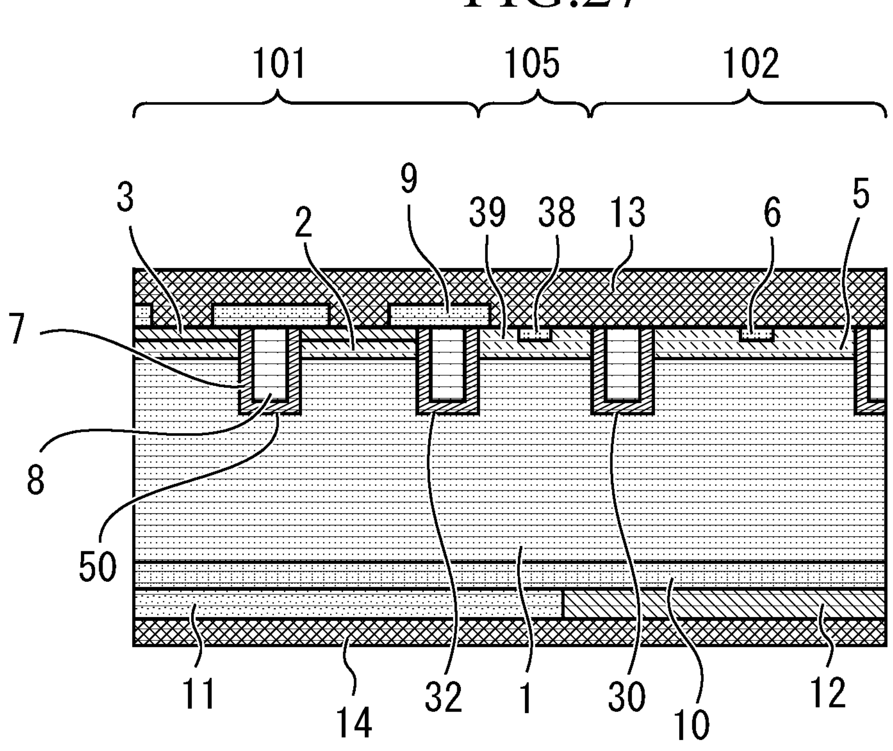
FIGS. 27-29 are sectional views of the semiconductor device according to the seventh embodiment.
Figure 28:
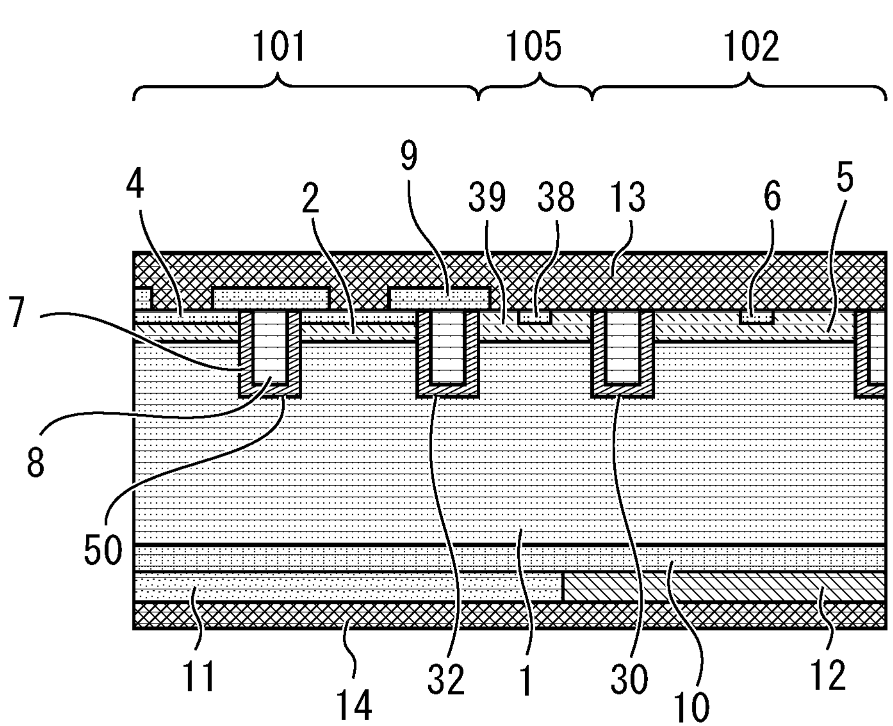
Figure 29:
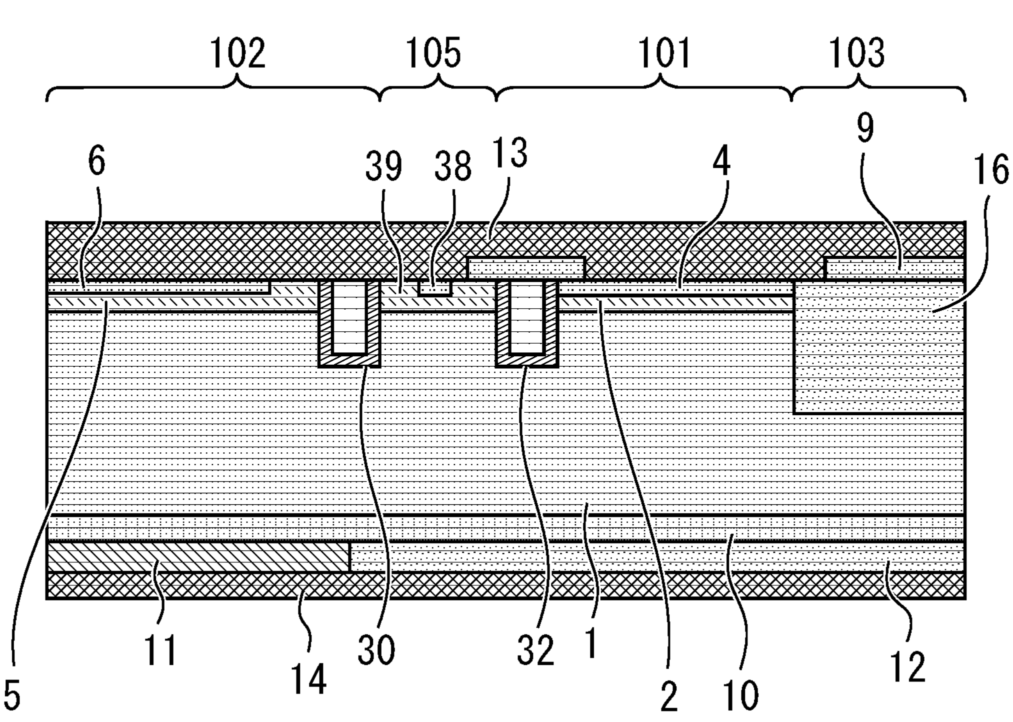

FIG. 26 is a partial plan view of a semiconductor device according to a seventh embodiment. FIG. 26 corresponds to the plan view of the broken line portion of FIG. 1. FIGS. 27 to 29 are a sectional view taken along line A'-A', a sectional view taken along line B'-B', and a sectional view taken along line C'-C' illustrated in FIG. 26, respectively.

The trench pitch of the FWD region 102 is wider than the trench pitch of the IGBT region 101. The pitch refers to an interval. In the example of FIG. 26, since there is only one dummy trench 40, the pitch of the dummy trench can be said to be infinite and is larger than the pitch of the trench 50 of the IGBT region 101. A plurality of dummy trenches 40 may be formed so long as the size relationship of the pitches is satisfied. Further, according to one example, in the FWD region 102, the area of the first p-type contact region 6 is smaller than the area of the p-type anode region 5 per unit cell.

By the adjustment of the trench pitch described above, in a state where a voltage is applied at the time of turn-off of the IGBT operation, the electric field intensity is stronger immediately below the trench of the FWD region 102 than immediately below the trench of the IGBT region 101. As a result, avalanche breakdown can be achieved not in the IGBT region 101 but in the FWD region 102 at the time of the avalanche, and overvoltage destruction can be prevented. That is, by setting the occurrence point of the avalanche breakdown in the FWD region 102, the overvoltage destruction can be prevented.

Eighth Embodiment

Figure 30:
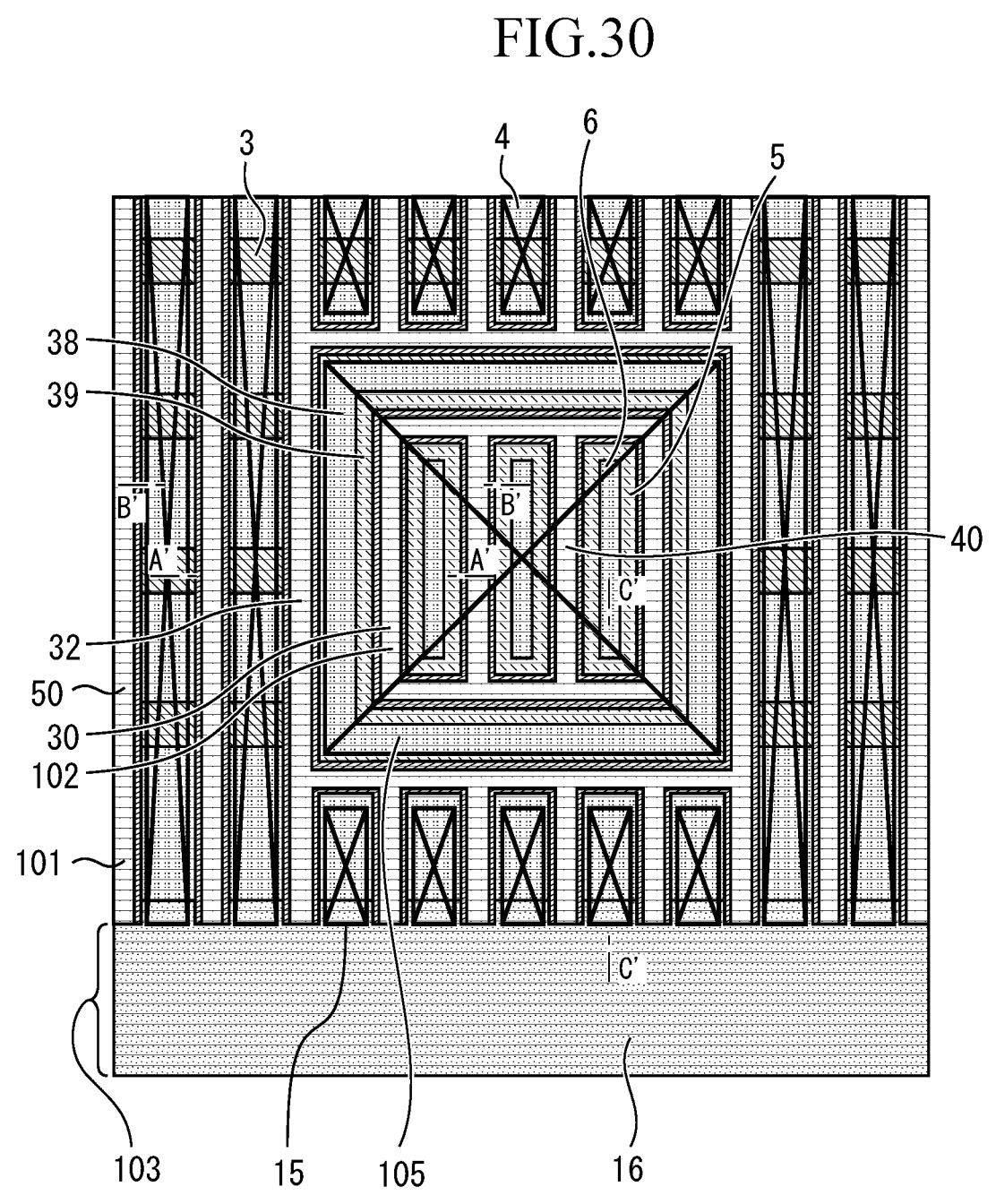
Figure 31:
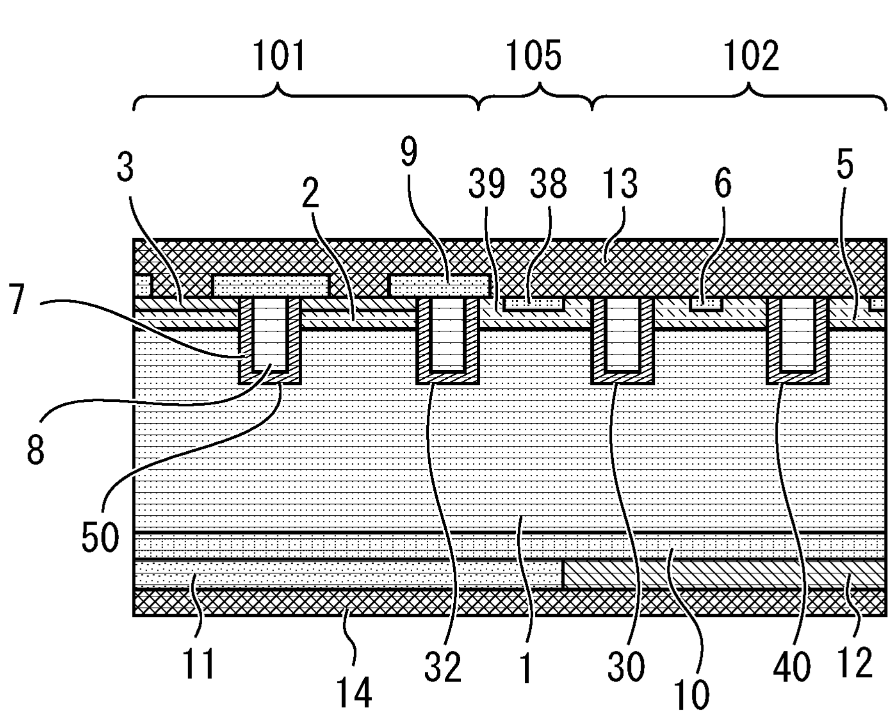
FIGS. 31-33 are sectional views of the semiconductor device according to the eighth embodiment.
Figure 32:
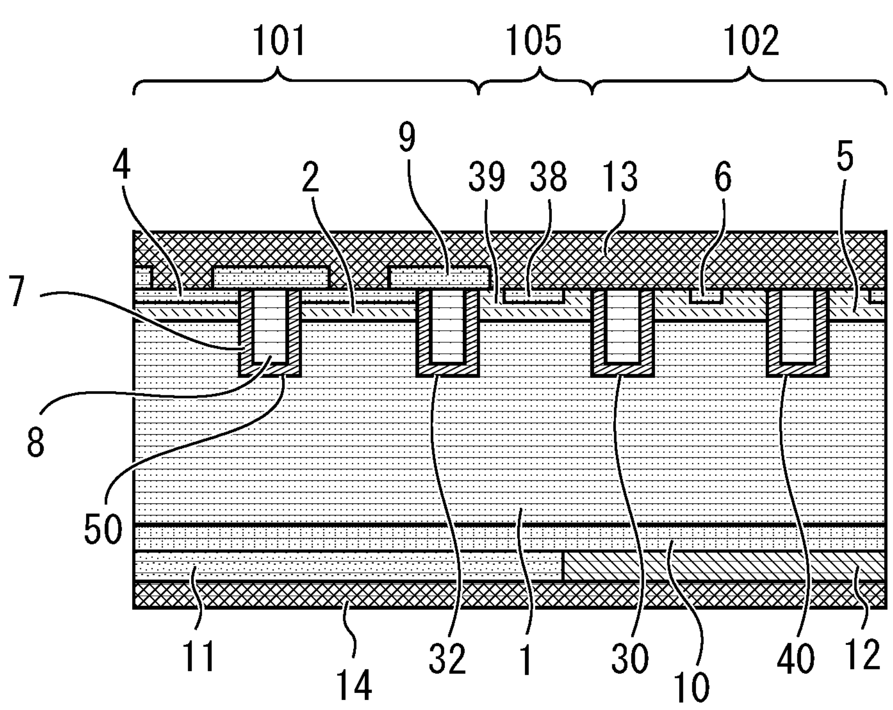
Figure 33:
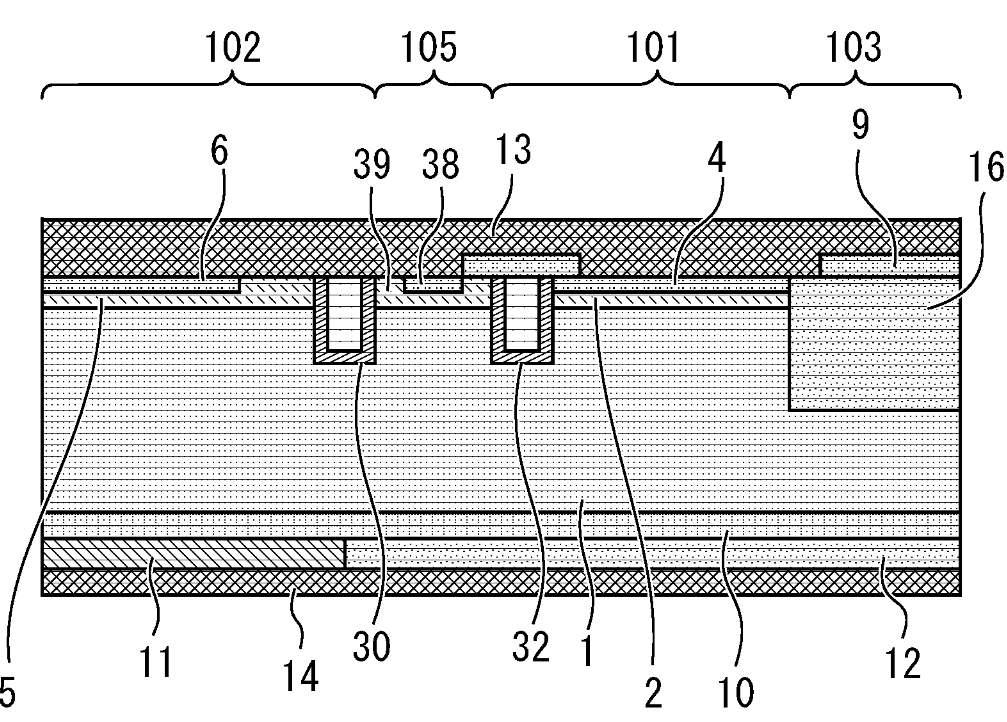

FIG. 30 is a partial plan view of a semiconductor device according to an eighth embodiment. FIG. 30 corresponds to the plan view of the broken line portion of FIG. 1. FIGS. 31 to 33 are a sectional view taken along line A'-A', a sectional view taken along line B'-B', and a sectional view taken along line C'-C' illustrated in FIG. 30, respectively.

The width of the first p-type region 38 in the boundary region 105 is larger than the width of the first p-type contact region 6 in the FWD region 102. Thus, in plan view, the area ratio of the first p-type region 38 to the boundary region 105 is larger than the area ratio of the first p-type contact region 6 to the FWD region 102 excluding the portion where the trench is formed. That is, the effective concentration of the anode of the boundary region 105 is higher than the effective concentration of a "surface mesa portion," which is a portion of the FWD region 102 excluding the portion where the trench is formed.

In the present embodiment, since the effective p-type impurity concentration of the boundary region 105 is set to be higher than that in the FWD region 102, the hole current passing through the boundary region 105 to the emitter electrode 13 during the IGBT operation increases, and the decrease in the reverse bias safe operating area can be prevented. Further, since the p-type impurity concentration also increases in the vicinity of the portion immediately below the n-type emitter region 3, which tends to cause latch-up, it is possible to further prevent the decrease in the reverse bias safe operating area during the IGBT operation.

In addition to the features described above, the width of the first p-type contact region 6 in the vicinity of the boundary region 105 in the FWD region 102 can be made larger than the width of the first p-type contact region 6 not in the vicinity. According to another example, the widths of a plurality of the first p-type contact region 6 can be gradually reduced as the distance from the boundary region 105 increases. As thus described, in the cell in the vicinity of the IGBT in the FWD region 102, the high-concentration first p-type contact region 6 is formed to be large, thereby enabling improvement in the reverse bias safe operating area during the IGBT operation.

Ninth Embodiment

Figure 34:
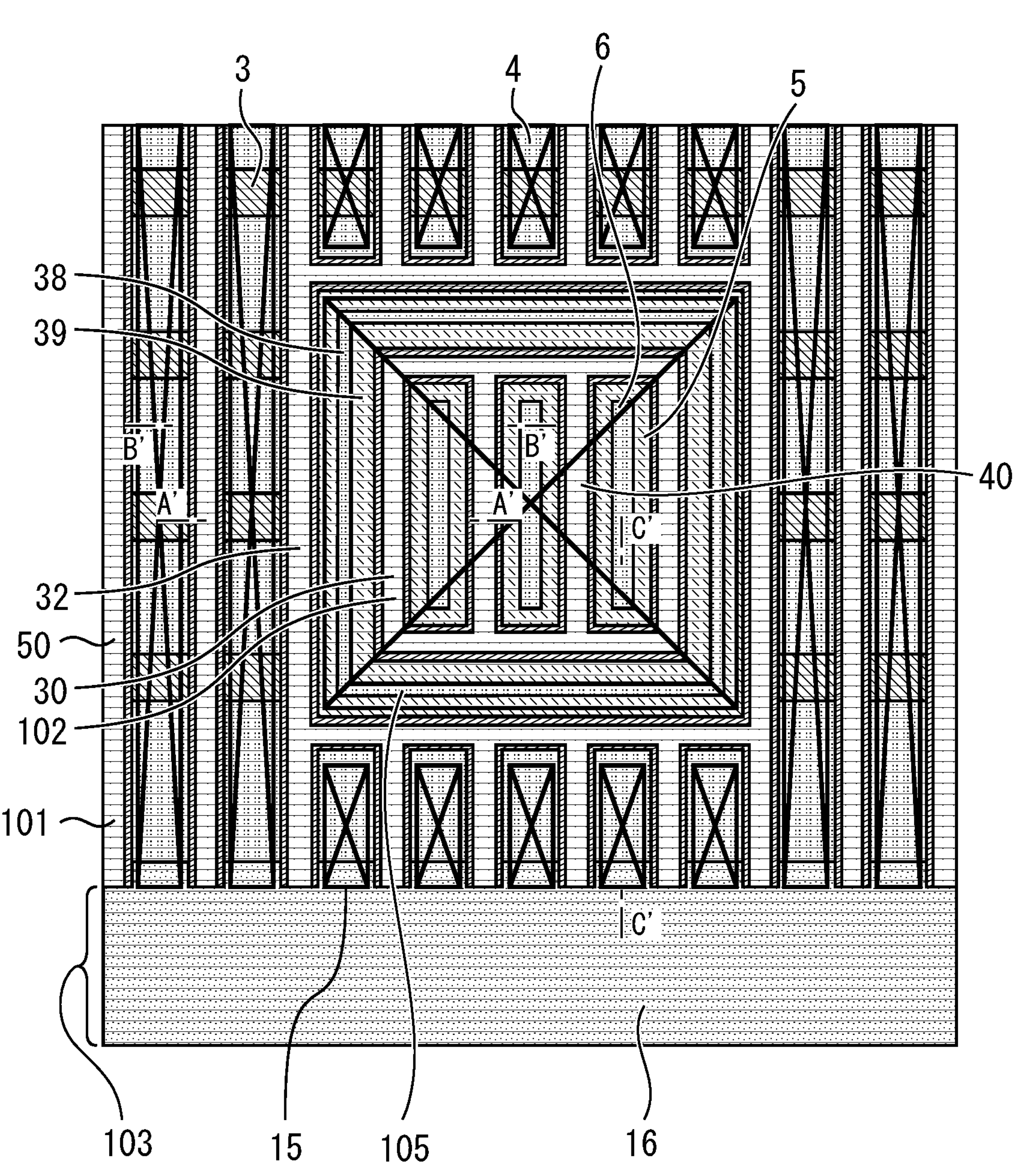
FIG. 34 is a partially enlarged view of a semiconductor device according to a ninth embodiment.
Figure 35:
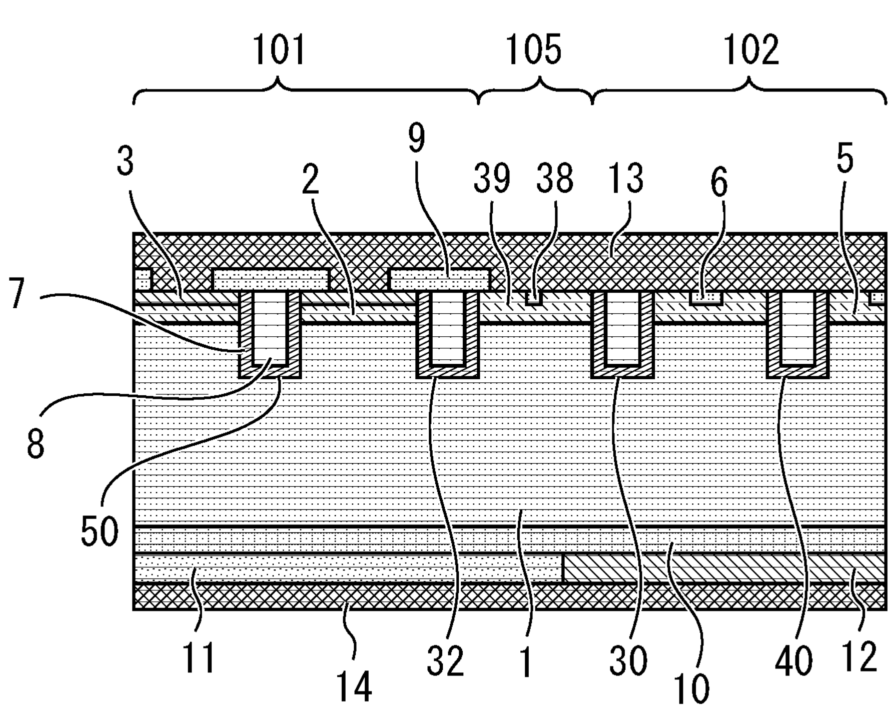
FIGS. 35-37 are sectional views of the semiconductor device according to the ninth embodiment.
Figure 36:
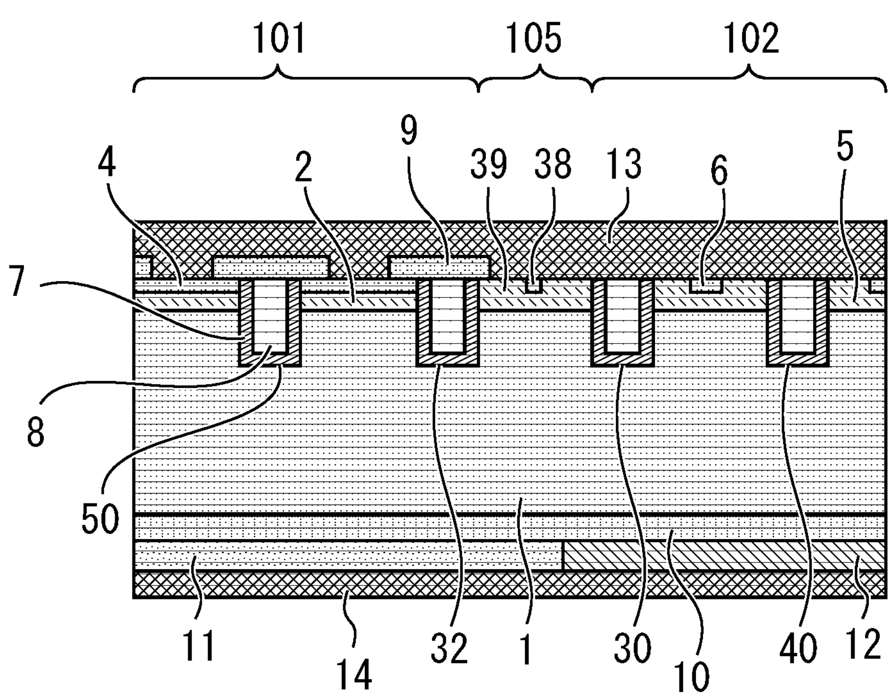
Figure 37:
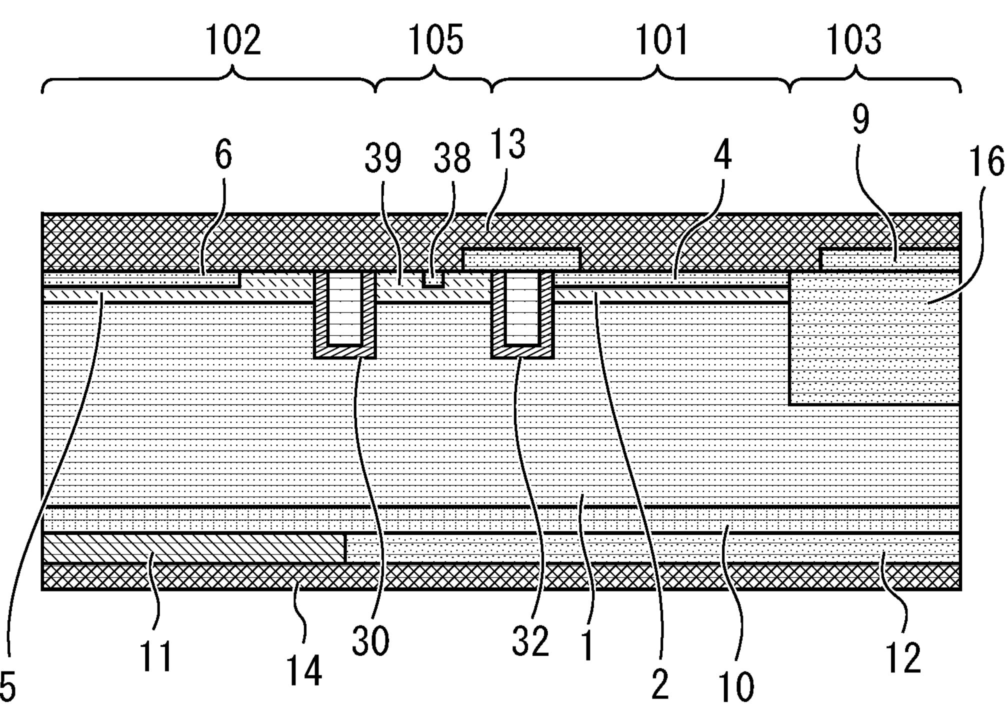

FIG. 34 is a partial plan view of a semiconductor device according to a ninth embodiment. FIG. 34 corresponds to the plan view of the broken line portion of FIG. 1. FIGS. 35 to 37 are a sectional view taken along line A'-A', a sectional view taken along line B'-B', and a sectional view taken along line C'-C' illustrated in FIG. 34, respectively.

The width of the first p-type region 38 in the boundary region 105 is smaller than the width of the first p-type contact region 6 in the FWD region 102. Thus, in plan view, the area ratio of the first p-type region 38 to the boundary region 105 is smaller than the area ratio of the first p-type contact region 6 to the FWD region 102 excluding the portion where the trench is formed. That is, the effective concentration of the anode of the boundary region 105 is lower than the effective concentration of a "surface mesa portion," which is a portion of the FWD region 102 excluding the portion where the trench is formed. As described above, the semiconductor device of the present embodiment has a feature opposite to that of the semiconductor device of the eighth embodiment.

During the diode operation, the boundary region 105 and the IGBT region 101 in the vicinity of the FWD region 102 operate as structural parasitic diodes with p-type impurities. It is desirable that the boundary region 105 and the IGBT region 101 do not operate as a diode. In the present embodiment, the recovery loss can be effectively reduced by lowering the average impurity concentration of the anode of the boundary region 105.

In addition to the features described above, the width of the first p-type contact region 6 in the vicinity of the boundary region 105 in the FWD region 102 can be made smaller than the width of the first p-type contact region 6 not in the vicinity. According to another example, the widths of a plurality of the first p-type contact region 6 can be gradually increased as the distance from the boundary region 105 increases. As thus described, by forming the high-concentration first p-type contact region 6 to be small in the cell in the vicinity of the IGBT in the FWD region 102, the above effect can be obtained. That is, the portion of the FWD region 102 near the boundary region 105 is made a low-concentration p-anode portion, so that the recovery characteristic can be improved.

Tenth Embodiment

Figure 38:
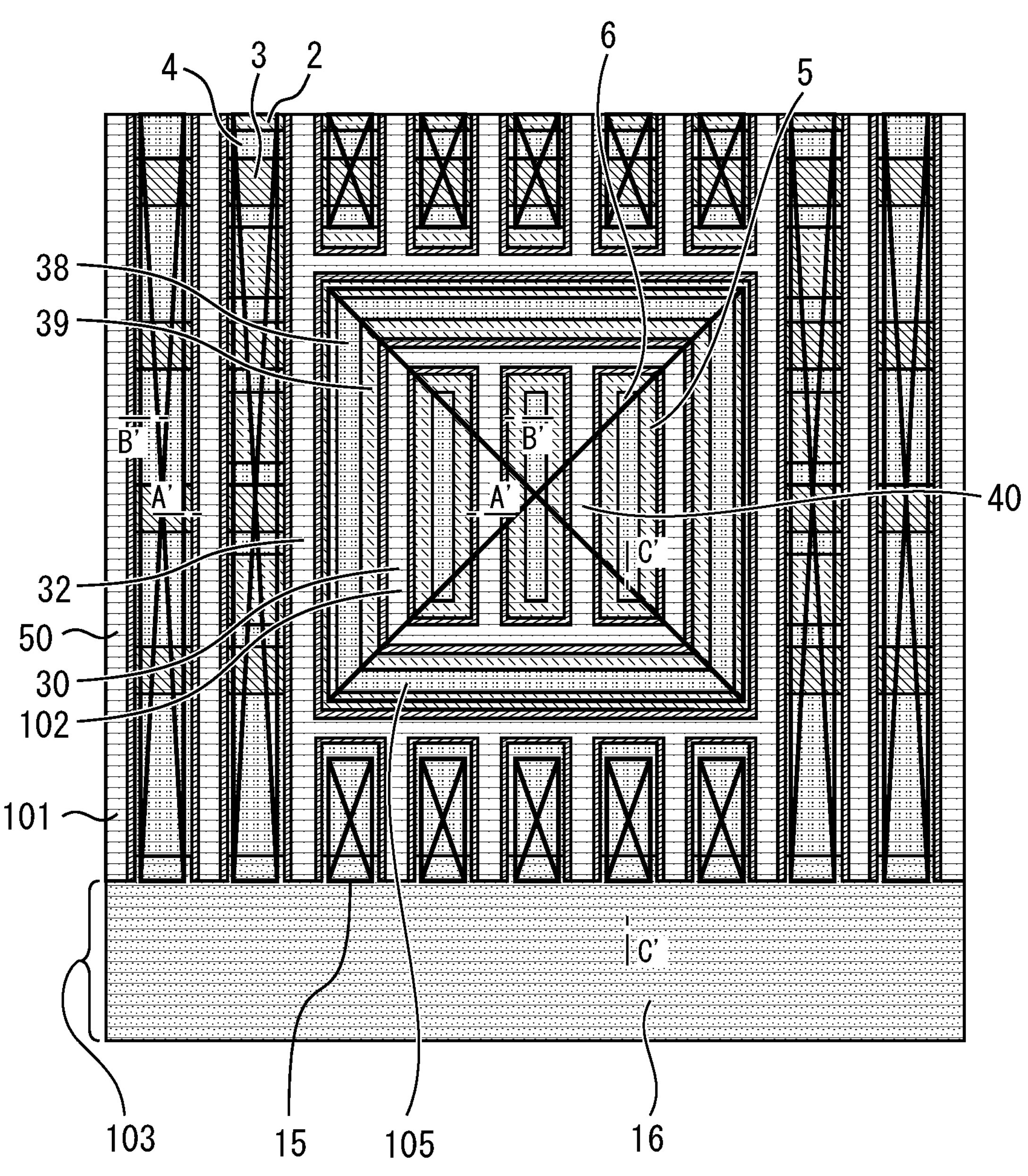
FIG. 38 is a partially enlarged view of a semiconductor device according to a tenth embodiment.
Figure 39:
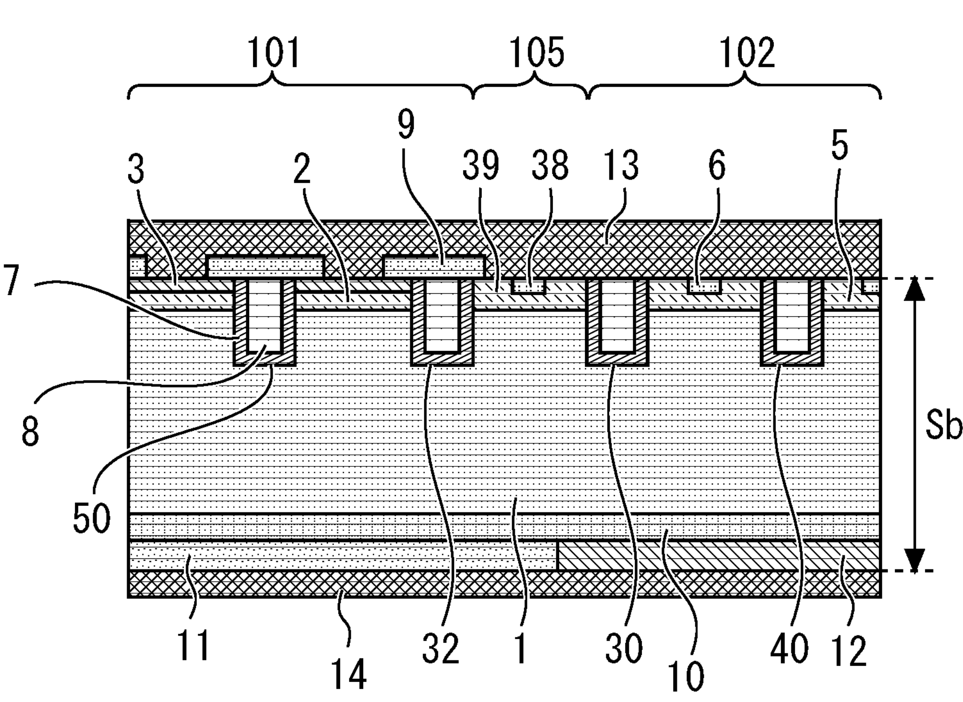
FIGS. 39-41 are sectional views of the semiconductor device according to the tenth embodiment.
Figure 40:
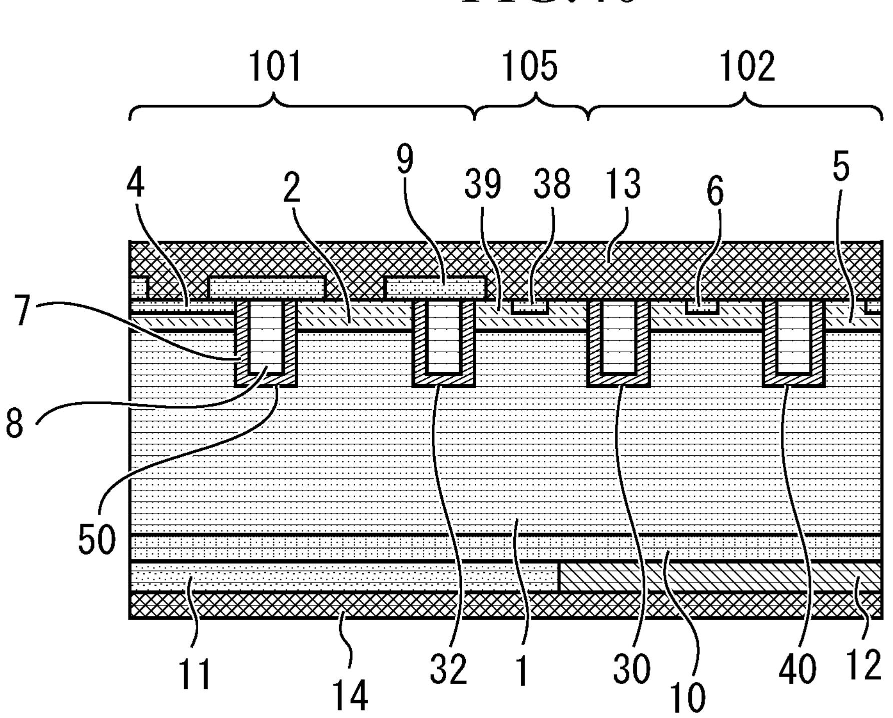
Figure 41:
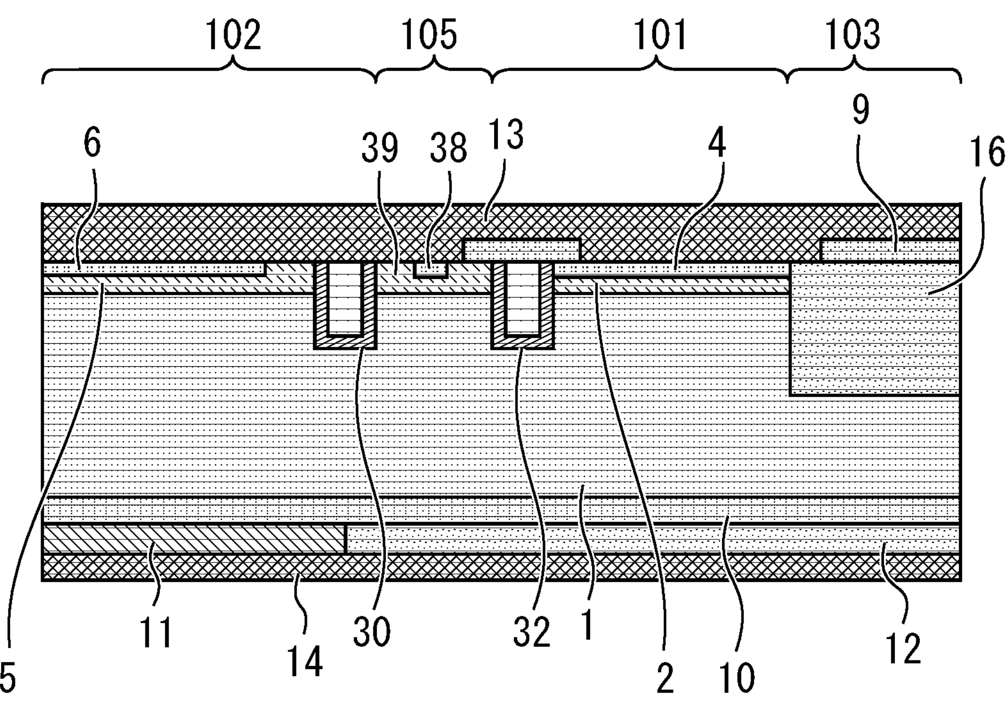

FIG. 38 is a partial plan view of a semiconductor device according to a tenth embodiment. FIG. 38 corresponds to the plan view of the broken line portion of FIG. 1. FIGS. 39 to 41 are a sectional view taken along line A'-A', a sectional view taken along line B'-B', and a sectional view taken along line C'-C' illustrated in FIG. 38, respectively.

Among the IGBT regions 101, a unit cell in contact with the boundary region 105 has a smaller area ratio of the second p-type contact region 4 than a unit cell not in contact with the boundary region 105. According to another example, in the IGBT region 101, the area ratio of the second p-type contact region 4 can be made smaller in a plurality of unit cells adjacent to the boundary region 105 than in the other unit cells. In order to reduce the area ratio of the second p-type contact region 4, for example, a portion where the second p-type contact region 4 exists in FIG. 1 can be changed to the channel dope 2. This lowers the average concentration of the p-type impurities in the IGBT region 101 in the vicinity of the FWD region 102. Thus, the hole diffusion in the IGBT region 101 in the on-state during the FWD operation is reduced, and the recovery loss can be reduced.

One or a plurality of unit cells may be used to reduce the area ratio of the second p-type contact region 4. According to another example, the area ratio of the second p-type contact region 4 per unit cell can be gradually decreased as the distance from the boundary region 105 increases.

Eleventh Embodiment

Figure 42:
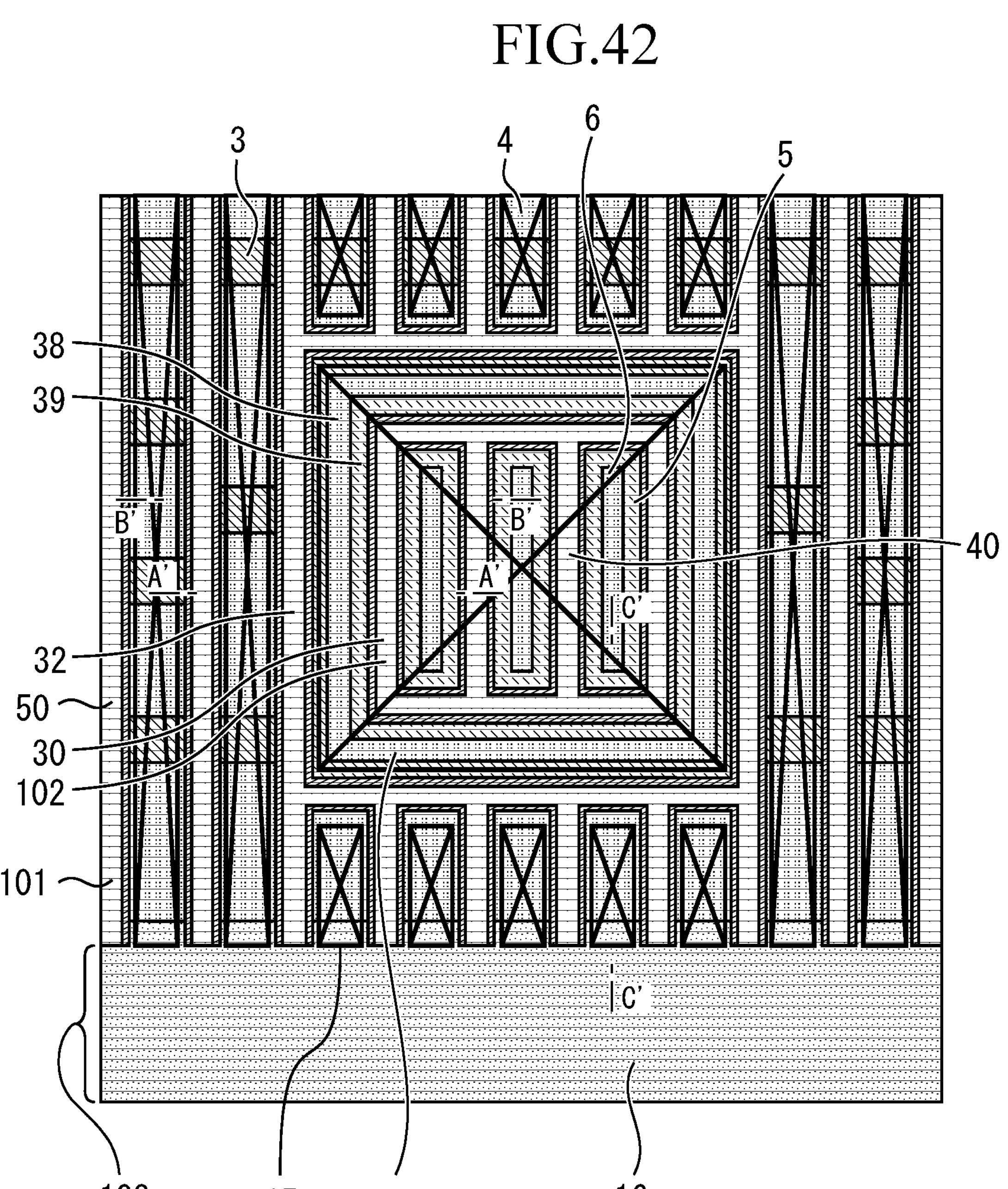
FIG. 42 is a partially enlarged view of a semiconductor device according to an eleventh embodiment.
Figures 43, 44:
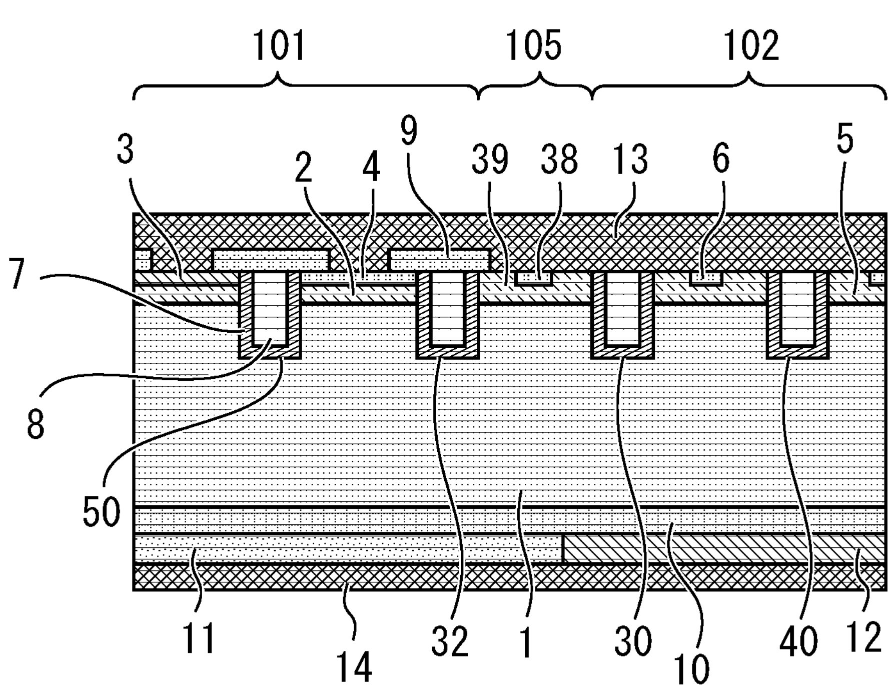
FIGS. 43-45 are sectional views of the semiconductor device according to the eleventh embodiment.
Figure 45:
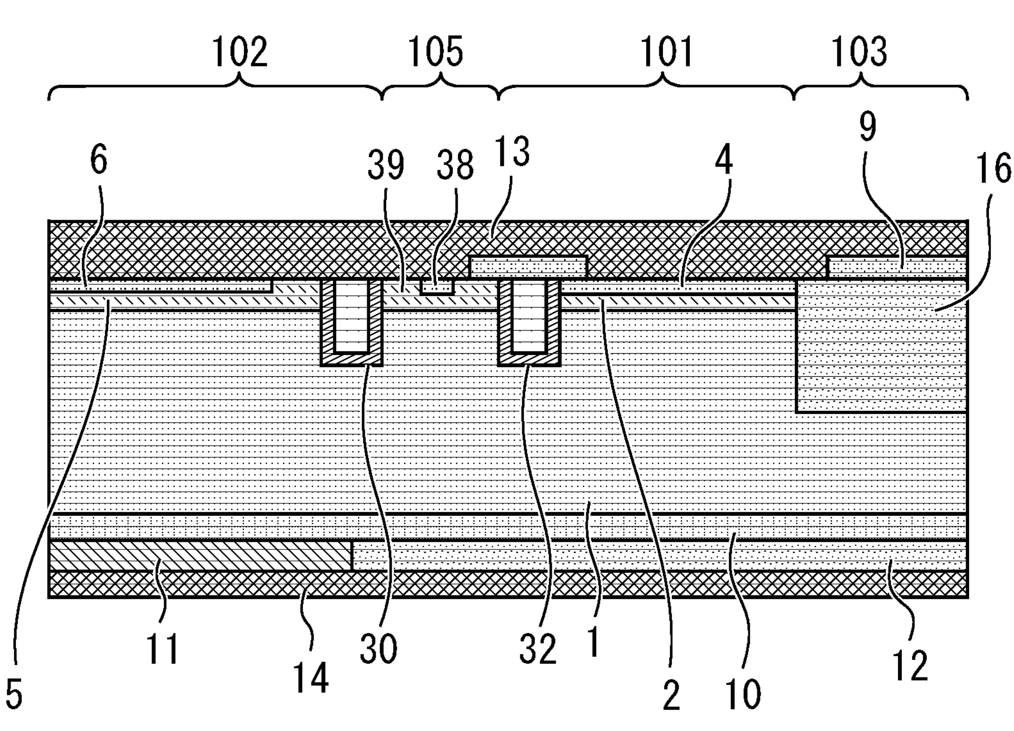

FIG. 42 is a partial plan view of a semiconductor device according to an eleventh embodiment. FIG. 42 corresponds to the plan view of the broken line portion of FIG. 1. FIGS. 43 to 45 are a sectional view taken along line A'-A', a sectional view taken along line B'-B', and a sectional view taken along line C'-C' illustrated in FIG. 42, respectively.

Among the IGBT regions 101, a unit cell in contact with the boundary region 105 has a larger area ratio of the second p-type contact region 4 than a unit cell not in contact with the boundary region 105. According to another example, in the IGBT region 101, the area ratio of the second p-type contact region 4 can be made larger in a plurality of unit cells adjacent to the boundary region 105 than in the other unit cells. According to another example, the area ratio of the second p-type contact region 4 can also be increased in the entire unit cell region surrounded by the trench.

This increases the average concentration of the p-type impurities in the IGBT region 101 in the vicinity of the boundary region 105. Therefore, as in the first embodiment, it is possible to enhance the effect of preventing the decrease in the reverse bias safe operating area during the IGBT operation.

While the RC-IGBT has been described in the first to eleventh embodiments, the features of these embodiments can be applied to a MOSFET or the like. An Si substrate may be employed as the substrate Sb, but this may be made with a wide bandgap semiconductor. The wide bandgap semiconductor includes, for example, silicon carbide, gallium nitride-based materials, or diamond. As the cell structure of the IGBT in the vicinity of the emitter electrode 13, the cell in which the trench gate extends in a stripe shape in one direction has been exemplified, but each of the features described above can be applied to a cell called a mesh type in which the trench gate extends vertically and horizontally and to a cell structure called a planar type other than the trench type. The feature according to each of the embodiments described above may be used in combination.

According to the present disclosure, since there is a boundary region having only a p-type region on its upper side at the boundary between the IGBT region and the FWD region, and the boundary region is surrounded by two annular trenches, it is possible to reduce recovery loss during FWD operation without lowering destruction resistance such as RBSOA.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2020-190383 filed on Nov. 16, 2020 including specification, claims, drawings and summary, on which the Convention priority of the present application is based, are incorporated herein by reference in its entirety.

The invention claimed is:

1. A semiconductor device comprising:

a FWD region that is formed on a substrate and has, on an upper surface side of the substrate, a p-type anode region, a first p-type contact region having a higher p-type impurity concentration than the p-type anode region, and a first trench;

an IGBT region that is formed on the substrate, surrounds the FWD region in plan view via a boundary region, and has an n-type emitter region, a second p-type contact region, and a second trench on the upper surface side of the substrate;

a peripheral region that surrounds the FWD region, the boundary region, and the IGBT region in plan view; and an emitter electrode on the upper surface of the substrate, wherein the first trench is formed annularly along an outer edge of the FWD region in plan view, the second trench is formed annularly along an outer edge of the boundary region in plan view, only a p-type region is provided on an upper surface side of the boundary region, the p-type region has a first p-type region and a second p-type region having a lower p-type impurity concentration than the first p-type region, the first p-type region and the second p-type region are in contact with the emitter electrode, in plan view, an area ratio of the first p-type contact region per unit cell in the FWD region is a first area ratio, an area ratio of the first p-type region per unit cell in the boundary region is a second area ratio, and an area ratio of the second p-type contact region per unit cell in the IGBT region is a third area ratio, and a sum of the first area ratio and the second area ratio is smaller than the third area ratio.

2. The semiconductor device according to claim 1, wherein in plan view, the sum of the first area ratio and the second area ratio is smaller than a sum of a fourth area ratio of the p-type anode region per unit cell in the FWD region and a fifth area ratio of the second p-type region per unit cell in the boundary region.

3. The semiconductor device according to claim 1, wherein the first p-type contact region is formed for each unit cell and has an elongated shape parallel to the first trench in plan view, and the first p-type region has an annular shape surrounding the FWD region in plan view.

4. The semiconductor device according to claim 1, wherein in plan view, the second p-type region is in contact with the second trench, and the first p-type region is not in contact with the second trench.

5. The semiconductor device according to claim 1, wherein the second p-type region and the first p-type region are in contact with the second trench in plan view.

6. The semiconductor device according to claim 5, wherein a portion of the first p-type region, in contact with the second trench in plan view, faces the n-type emitter region.

7. The semiconductor device according to claim 1, wherein the first p-type contact region is formed for each unit cell and has a plurality of rectangular portions parallel to the first trench in plan view, and a longitudinal length of each of the plurality of rectangular portions is larger than a distance between the plurality of rectangular portions.

8. The semiconductor device according to claim 7, wherein an area of the first p-type contact region is smaller than an area of the p-type anode region in plan view.

9. The semiconductor device according to claim 1, wherein the p-type anode region has a portion linearly formed in plan view and having the first p-type contact region formed partially, and a portion linearly formed in plan view and having no first p-type contact region formed partially, and the p-type region is formed in an annular shape by the first p-type region and the second p- type region being alternately provided in plan view.

10. The semiconductor device according to claim 9, wherein a sum of areas of the first p-type contact region and the first p-type region is smaller than a sum of areas of the p- type anode region and the second p-type region.

11. The semiconductor device according to claim 1, wherein the first p-type contact region and the p-type anode region are alternately provided in plan view, and the first p-type region and the second p-type region are alternately provided in plan view.

12. The semiconductor device according to claim 1, comprising trenches provided in a grid in the FWD region in plan view, wherein in plan view, a plurality of regions, in each of which the first p-type contact region and the p-type anode region are formed, are provided, and an area of the first p-type contact region is smaller than an area of the p-type anode region.

13. The semiconductor device according to claim 1, wherein a trench pitch of the FWD region is wider than a trench pitch of the IGBT region.

14. The semiconductor device according to claim 1, wherein in plan view, a sixth area ratio of the first p-type region to the boundary region is larger than a seventh area ratio of the first p-type contact region to the FWD region excluding any portions in which any trench is formed.

15. The semiconductor device according to claim 1, wherein in plan view, a sixth area ratio of the first p-type region to the boundary region is smaller than a seventh area ratio of the first p-type contact region to the FWD region excluding any portions in which any trench is formed.

16. The semiconductor device according to claim 1, wherein in the IGBT region, a unit cell in contact with the boundary region has a smaller area ratio of the second p-type contact region than a unit cell not in contact with the boundary region.

17. The semiconductor device according to claim 1, wherein in the IGBT region, a unit cell in contact with the boundary region has a larger area ratio of the second p-type contact region than a unit cell not in contact with the boundary region.

18. The semiconductor device according to claim 1, wherein the IGBT region includes a p-type collector layer, the p-type collector layer extending into the boundary region so as to overlap the p-type region in plan view, and the p-type collector layer terminates directly below a second p-type region in the boundary region before reaching a position directly below the p-type anode region in the FWD region.

19. The semiconductor device according to claim 1, wherein the peripheral region has a p-type well region, and the well region and the second p-type contact region are in contact with each other in plan view.

20. The semiconductor device according to claim 19, wherein the well region directly contacts the emitter electrode, which is connected to the second p-type contact region.

21. The semiconductor device according to claim 19, wherein the well region is spaced from a gate trench disposed in the IGBT region that is closest to the well region.

22. The semiconductor device according to claim 19, wherein the well region and the second p-type contact region are in direct contact with each other in plan view such that holes in the peripheral region flow from the well region through the second p-type contact region.

* * * * *